United States Patent
Kirichenko et al.

(10) Patent No.: US 12,199,603 B2
(45) Date of Patent: Jan. 14, 2025

(54) CONTROLLER FOR A SUPERCONDUCTING QUBIT

(71) Applicant: SeeQC, Inc., Elmsford, NY (US)

(72) Inventors: Alex Kirichenko, Elmsford, NY (US); Maxim Vavilov, Elmsford, NY (US); Oleg Mukhanov, Elmsford, NY (US)

(73) Assignee: SEEQC, INC., Elmsford, NY (US)

( * ) Notice: Subject to any disclaimer, the term of this patent is extended or adjusted under 35 U.S.C. 154(b) by 63 days.

(21) Appl. No.: 18/197,033

(22) Filed: May 12, 2023

(65) Prior Publication Data
US 2024/0380399 A1    Nov. 14, 2024

(51) Int. Cl.
*H03K 17/92* (2006.01)
*H03K 3/38* (2006.01)

(52) U.S. Cl.
CPC .............. *H03K 17/92* (2013.01); *H03K 3/38* (2013.01)

(58) Field of Classification Search
CPC ....................................................... H03K 17/92
USPC .................................................. 327/527, 528
See application file for complete search history.

(56) References Cited

U.S. PATENT DOCUMENTS

| 11,385,099 | B1* | 7/2022 | Jafari-Salim | G06F 1/20 |
| 2022/0399145 | A1* | 12/2022 | Kirichenko | H01F 6/006 |
| 2024/0020562 | A1* | 1/2024 | Miano | G06N 10/40 |

* cited by examiner

*Primary Examiner* — Tomi Skibinski
(74) *Attorney, Agent, or Firm* — Perkins Coie LLP

(57) ABSTRACT

A superconducting controller for a superconducting qubit to execute high fidelity quantum gates using magnetic flux drive. The controller comprises: an inductance forming an inductive loop and configured to be inductively coupled to a qubit with a small mutual inductance; a pulse shaping circuit configured to apply a current pulse with a predefined shape across the inductance. The pulse shaping circuit comprises: a superconducting circuit configured to output single flux quanta (SFQ) pulses and a digital counter circuit configured to produce the shape of the current (magnetic flux) pulse by controlling the number of SFQ pulses applied to the inductive loop by incrementing or decrementing the current across the inductance by one SFQ pulse at a time.

26 Claims, 26 Drawing Sheets

307

305

303

301

CONTROLLER FOR A SUPERCONDUCTING QUBIT

TECHNICAL FIELD

Embodiments described herein relate to quantum computing devices, systems, including a controller for a superconducting quantum bit ("qubit").

BACKGROUND

Quantum computing will provide the new paradigm of computers. Classical computers hold and manipulate information in the form of bits which are represented by two states 0 or 1 (e.g., low signal or high signal). In quantum computing, instead of a classical bit in definitely one of two states, information is stored in quantum bit devices ("qubits") and such qubits can be manipulated to form a quantum superposition of different quantum states (e.g., two quantum states).

DETAILED DESCRIPTION

Figure 1A:
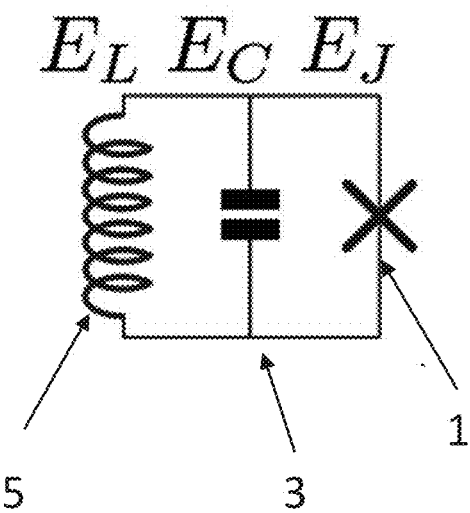
FIG. 1A is a schematic of one example of a superconducting qubit.

Various architectures have proposed for the formation of qubits for quantum computing. One of these are superconducting circuits. Such superconducting qubits need to be operated at low subKelvin temperatures below critical temperature of superconducting transition. The control and read-out of these qubits are challenging and traditionally have been provided by exciting the qubits using microwave pulses. However, such control schemes require the microwave signals to be supplied via high quality coaxial cables to the qubits inside of the cryostat. The cabling needed to provide control signals from outside of the cryostat to the qubits located inside of the cryostat typically requires at least one or two connections for each qubit. As a result, the number of required coaxial cables with associated connectors, filters, attenuators goes proportional to the number of qubits which makes system scaling challenging due the space and reliability constraints as well as increasing heat load to the cryostat due to microwave power dissipation and heat flow via cables.

In an embodiment of the disclosed technology, a controller for a superconducting qubit is provided, the controller comprising:

an inductance forming inductive loop and configured to be inductively coupled to a qubit with a small mutual inductance;

a pulse shaping circuit configured to apply a current pulse with a predefined shape across the inductance, the pulse shaping circuit comprising:

a superconducting circuit configured to output single flux quanta "SFQ" pulses; and a counter circuit configured to produce the shape of the current pulse by controlling the number of SFQ pulses applied through the inductance by incrementing or decrementing the current across the inductance one SFQ pulse at a time.

The above controller is based on single flux quantum (SFQ) circuits which can be provided in a dilution fridge or cryostat and located in proximity of a qubit. The qubit and controller may both be provided in a low temperature measurement system at a temperature of less than superconducting transition temperature.

In the above embodiment, the pulse shaping circuit is configured to apply a current (magnetic flux) pulse. SFQ circuits output SFQ pulses are low power and can be driven at high clock frequencies such as 25-30 GHz or higher. They are classical superconducting circuits.

The above controller inductively couples to the qubit changing the frequency of quantum state precession, as the current across the inductance is changed. The inductance may be in the form of an inductive loop which is configured to be inductively coupled to the qubit. Fine control of the current across the inductance is possible due to the incrementing or decrementing magnetic flux inside superconducting loop using SFQ pulses. Magnetic flux threading a conducting loop is directly proportional to the current flowing in the loop.

In an embodiment, the counter circuit is configured to produce the shape of the current pulse (or equivalent magnetic flux pulse) across superconducting loop by applying counted number of SFQ pulses from one side (positive SFQ pulses to increment flux in the loop) or other side (negative SFQ pulses to decrement flux in the loop) or set time between flux incrementing/decrementing (plateau). The counter circuit also allows setting delays between sequentially generated current (flux) pulses.

The above allows a trapezium (trapezoid) shaped pulse to be applied. For this, the counter circuit is configured to produce a current pulse with a shape which comprises a rising edge where positive SFQ pulses are incrementally applied, a plateau region where the current across the inductance is fixed (no positive or negative SFQ pulses are applied) and a falling edge where negative SFQ pulses are incrementally applied to reduce the current induced in the inductance. The pulse shape may be further modified, for example, by providing a plurality of plateaus, rising and falling edges.

In an embodiment, the superconducting circuit comprises a Josephson Junction "JJ" and is configured to output an SFQ pulse, a voltage pulse with quantized area due to the 2pi phase slip across the JJ. The superconducting circuit may be at least one of the following types: rapid single flux quantum "RSFQ"; ERSFQ, eSFQ, RQL, xSFQ, xeSFQ, DSFQ, bSFQ, PCL and their variants and also circuits based on quantum flux parametrons "QFP": AQFP, QFP, PQ and their variants.

In an embodiment, the counting circuit comprises a first counter configured to count and limit the number of positive SFQ pulses and a second counter configures to count and limit the number of negative SFQ pulses. The first counter and the second counter may each comprise a register. The registers may comprise a plurality of superconducting T Flip flops "TFFs".

A third counter may also be provided, the third counter being configured to control the time duration for when no pulses are being applied to the coupling inductance.

Each register may be configured to output a carry signal when its limit has been reached, the controller being configured such that the first, second and third counters are arranged in a sequence and the carry signals are directed from one counter to the next counter in the sequence to start the next counter in the sequence.

The controller may be configured to produce a pulse shape with a repeating structure, the controller further comprising a fourth counter being configured to control the time between the structures of the pulse shape with the repeating structures. The structure may be a trapezium or variation thereof, for example, a triangle, or a trapezoidal shape with one or more further plateaux (for example, several trapeziums on top of each other), the structure may or may not be symmetric.

In a further embodiment, controller, is adapted to control a plurality of qubits via a de-multiplexer (demux). For example, a plurality of inductances may be provided such that each inductance out of the plurality of inductances is configured to be coupled to a respective qubit.

A positive input and a negative input may then be provided across each inductance, the positive input being configured to increase the flux across its respective inductance and the negative input being configured to decrease the flux across its respective inductance, the de-multiplexer being connected to the positive and negative input for each inductance.

The demultiplexer may be configured to receive a pulse stream and a selection signal to control which of the respective positive and negative inputs of each inductance are to receive the pulse stream. This arrangement where the demux controls output to both the positive and negative inputs means that a single pulse counter can be used for outputting pulses to the positive or negative inputs. The polarity of the pulses output to the inductance being controlled by the demux.

In order to adjust parameters of the pulse shape (including the rising and falling edges, plateau and wait time durations, etc.) for a particular selected qubit, a programmable counters can be used to be reprogrammed for a different number of pulse counts. The demux design shown in FIG. 20 and FIG. 23 can also be programmed to select multiple qubits at the same time. In this case, the selected qubits will be controlled by the pulse shape with the same parameters.

The demultiplexer may comprise a shift register, the selection signal being provided sequentially along the shift register. This type of arrangement allows superconducting logic of SFQ or QFP type to be employed for the demux.

The shift register may comprise non-destructive read-out "NDRO" components provided in sequence, with an NDRO coupled a respective positive or negative input. When more complicated pulse shapes are required, the shift register arrangement of the demux might provide some limitations as the pattern applied to a pair of NDROs will be shifted to the next pair of NDROs which may be controlling another qubit for which that pattern is not suitable. Therefore, in an embodiment, the shift register, further comprises dummy components between the NDROs which allow the selection signal to be stored before being passed to the next NDRO in the sequence.

In an embodiment, the controller of claim 9, wherein counting circuit comprises two further counters.

In an embodiment, the pulse shape is configured to allow a qubit which is inductively coupled to the controller to perform qubit operations.

In an embodiment, the controller is configured to allow control of at least one of the following parameters:
  the size of the plateau(s).
  the size of rising edge(s),
  the size of falling edge(s),
  the delay between sequentially generated flux pulses,
  the delay before the start of the first flux pulse.

In use, the controller will be inductively coupled to a qubit. In an embodiment, the qubit is a flux-type qubit with inductance. For example, the qubit may be a fluxonium type qubit.

However, it should be noted that flux bias control can be used for qubits where inductor is not explicit. For example, charge qubits such as transmons can still be connected to magnetically and driven using SQUIDs (Superconducting Quantum Interference Devices) loops or sometimes called split Josephson junctions.

A quantum computer comprises qubits which differ from classical bits in that they hold a quantum superposition of a first logic state (0) and a second logic state (1). The qubit can be visualised as having 2 quantum energy levels:

$$|0\rangle = \begin{pmatrix} 1 \\ 0 \end{pmatrix} \text{ and } |1\rangle = \begin{pmatrix} 0 \\ 1 \end{pmatrix}$$

FIG. 1A shows a schematic of a fluxonium qubit. Other types of qubits can also be used. However, as a first example, a fluxonium qubit will be discussed. The fluxonium qubit comprises a Josephson Junction (JJ) 1, a capacitor 3 and an inductor 5 each arranged in parallel with one another. $E_J$ is a measure of the strength of the coupling across the Josephson Junction, $E_C$ is the energy needed to increase the charge on the capacitor by e, where e is a single electron charge, and $E_L$ is the inductive energy of the qubit.

A JJ comprises a tunnel barrier between two superconductors. The fluxonium qubit is a type of so-called flux qubit where the two energy levels that form the qubit are a superposition of the two energy states, for example, corresponding to the current flow in opposing directions through the Josephson junction 1. In this example, the inductance is shown as an inductor. However, the inductance may be provided by JJs.

Figure 1B:
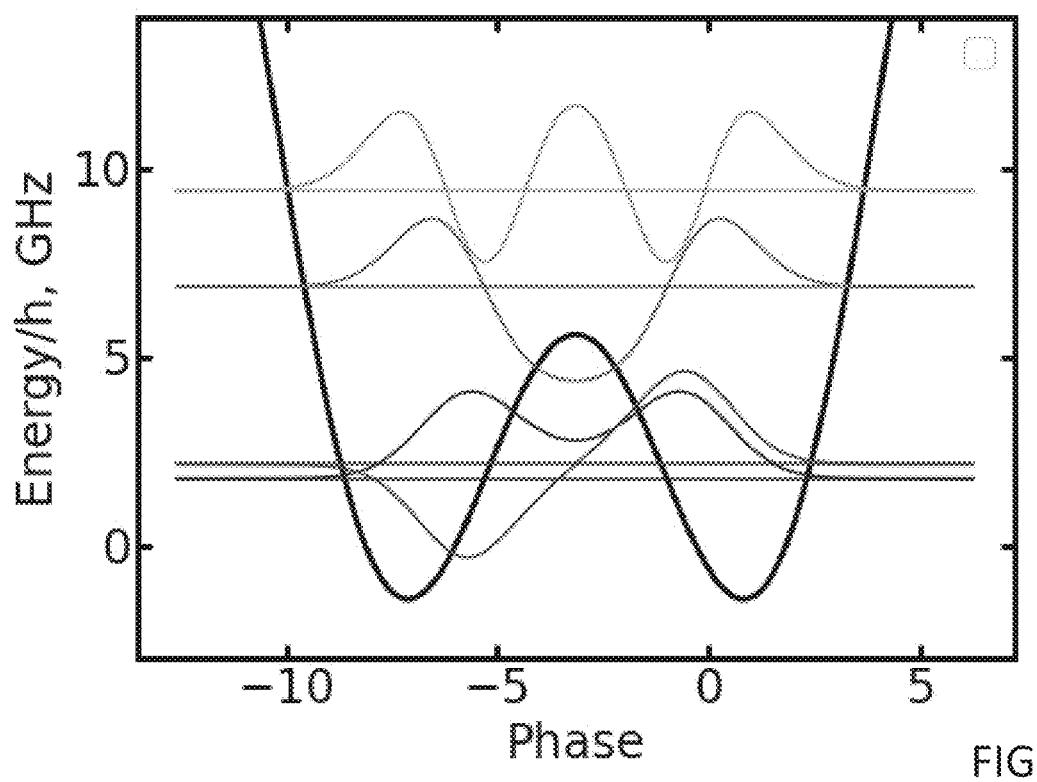
FIG. 1B is an energy diagram of an example of a fluxonium qubit.

The arrangement of the fluxonium qubit gives rise to the energy diagram shown in FIG. 1B. The two lowest levels of the energy diagram are selected as the two levels of the qubit.

Figure 2:
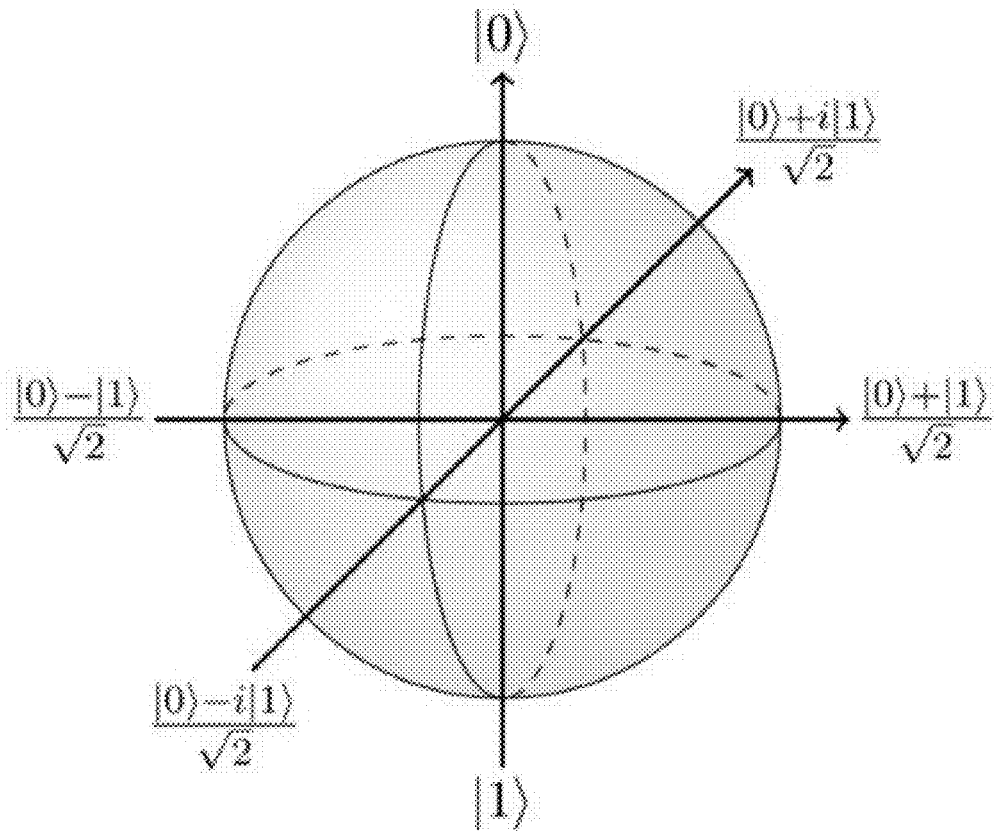
FIG. 2 is a diagram of a Bloch sphere.

Visualising the two states and the transition between the two states is best thought of using the Bloch sphere which is shown in FIG. 2. Here, the ground state $|0\rangle$ is shown at the top and the excited state $|1\rangle$ (pure) at the bottom. The quantum state of the qubit is represented by the position of the vector on the Bloch sphere. If the vector is not positioned at one of the vertical poles, it represents a superposition of states. The central plane (equator) of the sphere represents an equal superposition of $|0\rangle$ and $|1\rangle$.

Figure 3:
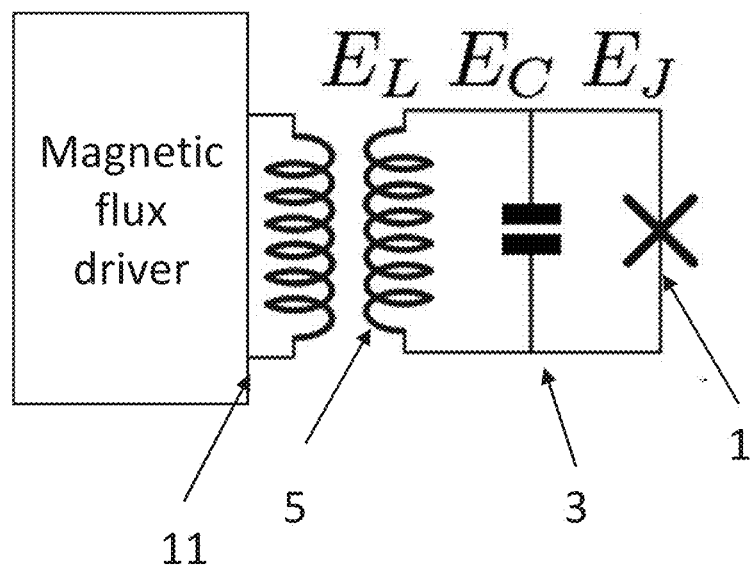
FIG. 3 is a diagram of an example of a fluxonium qubit coupled to a controller.

To switch the qubit from an (eigen) energy state to a superposition of states, the qubit is provided with energy to cause a transition between the ground state and excited state. In an example which is shown schematically in FIG. 3, this is achieved using a control circuit 11 which is inductively coupled to the qubit. The control circuit 11 induces a current across its inductor 13 which induces a magnetic flux through the qubit. In order to correctly excite the superposed state, the current across the inductor of the control circuit needs to be carefully varied in time, i.e., have precise values at certain times.

Figure 4A:
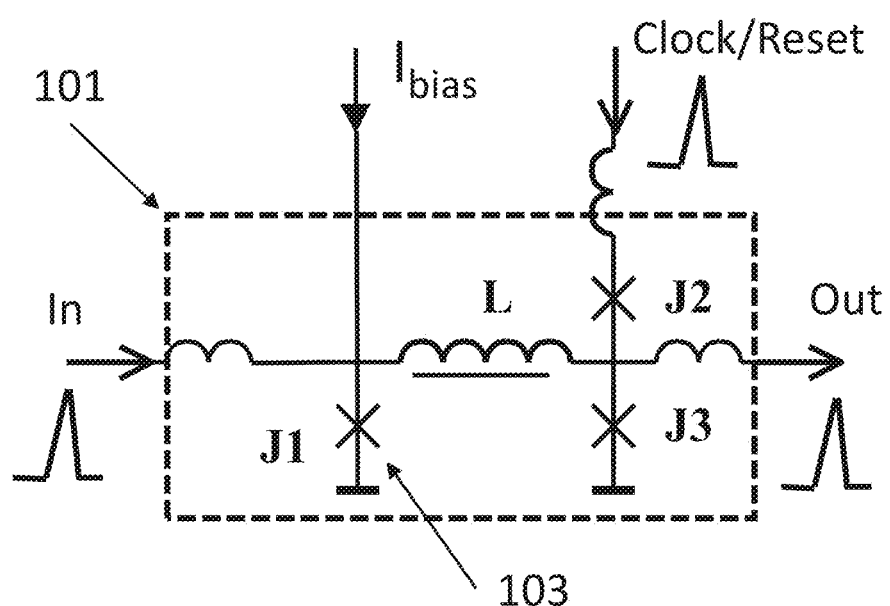
FIG. 4A is a diagram of an example of a single flux quantum circuit (SFQ)

To achieve this control, in an embodiment, control circuit 11 comprises a single flux quantum (SFQ) circuit. FIG. 4A is a diagram of a single flux quantum circuit (SFQ), 101. A simple form of SFQ circuit is a loop of superconducting wire with Josephson Junctions 103 which can hold (store) a single quantum of magnetic flux $\Phi_0$. Where $\Phi_0=h/2e$, h is Planck's constant and e is the elementary charge which is the electric charge carried by a single electron (1.6×10$^{-19}$ C). Josephson junctions enable the insertion or release of single flux quantum (SFQ) from this loop. The serially connected pairs of Josephson junctions (J2, J3) allow conditional release of the stored SFQ from the loop upon arrival of clock/reset SFQ. Releasing SFQ from the loop produces and output SFQ pulse. An SFQ pulse produced in this manner has a fixed area under its curve which corresponds to the flux quantum $\Phi_0$.

The use of an SFQ circuit to apply a flux to the qubit has two strong advantages:
1) The quantised single flux quanta pulses allow the energy provided to the qubit to be very carefully controlled; and
2) SFQ circuits can be provided in a dilution fridge or cryostat in close proximity to the qubits minimizing the number of connections to room temperature electronics and reducing the control signal latency.

The SFQ circuit may be configured to produce a flux pulse profile by using SFQ pulses to deposit $\Phi_0$ increments of magnetic flux in superconducting inductive loop to produce a magnetic flux profile which will allow the state of the qubit to be changed.

Figure 4B:
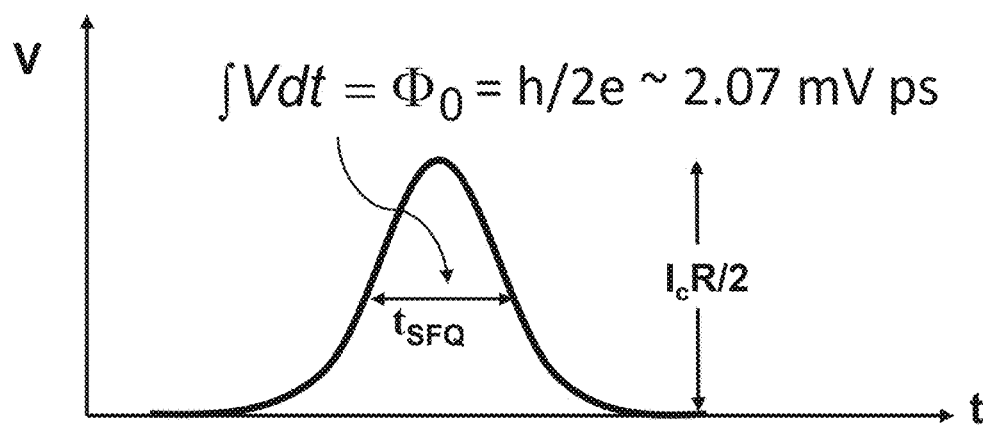
FIG. 4B is a diagram of an example of an SFQ pulse.

FIG. 4B, shows an SFQ pulse against time. The SFQ pulse has a constant area. The SFQ pulse width is $t_{SFQ} \sim 2\tau_{SFQ} \sim 2\Phi_0/I_c R$. For Nb junctions, ultimate limit $t_{SFQ} \to 0.4$ ps; for complex RSFQ circuits, practical $f_{clock} \sim 1/(10\, t_{SFQ})$. The SFQ pulse energy $\sim \frac{3}{4}\, \Phi_0 I_c \sim 2 \times 10^{-19}$ Joule (for $I_c \sim 100$ μA for 4K operation) or $2 \times 10^{-20}$ Joule (for $I_c \sim 10$ μA for milliKelvin operations). The maximum clock frequency for integrated circuit (IC) can be ~100s GHz at low power.

Figure 5:
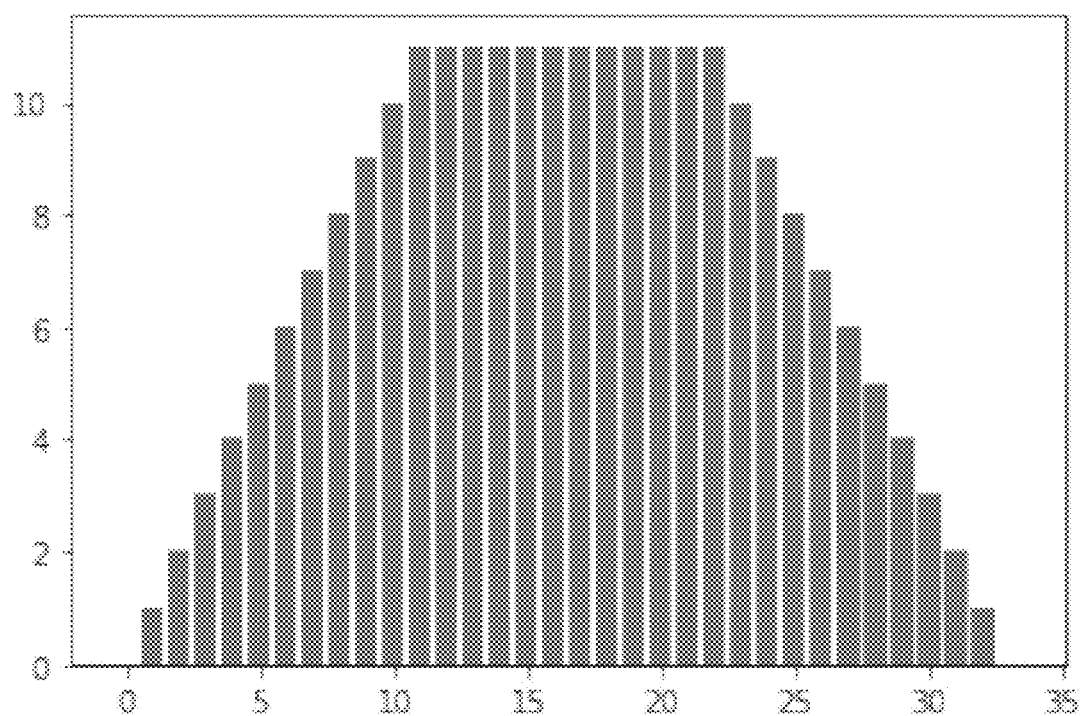
FIG. 5 is a diagram of an example of a pulse shape which can be produced by a pulse shaping circuit in accordance with an embodiment.

FIG. 5 shows a flux profile which is of the shape of a trapezium. The shape is made by controlling the addition single flux quanta. The vertical Y axis shows the number of positive single flux quanta applied to the inductor L of circuit 11. The horizontal X axis is an arbitrary unit of time which corresponds to the number of periods of the internal clock of the controller. As time increases the number of flux quanta is incremented by 1 for each unit of time until, in this example, a value of 16 is reached. This value is held at a plateau for a while and then the number of flux quanta are decreased, by a value of one quanta at a time until 0.

FIGS. 6A to 6E show how a state transition caused by the current profile of FIG. 5 progresses with reference to a Bloch sphere.

Figure 6A:
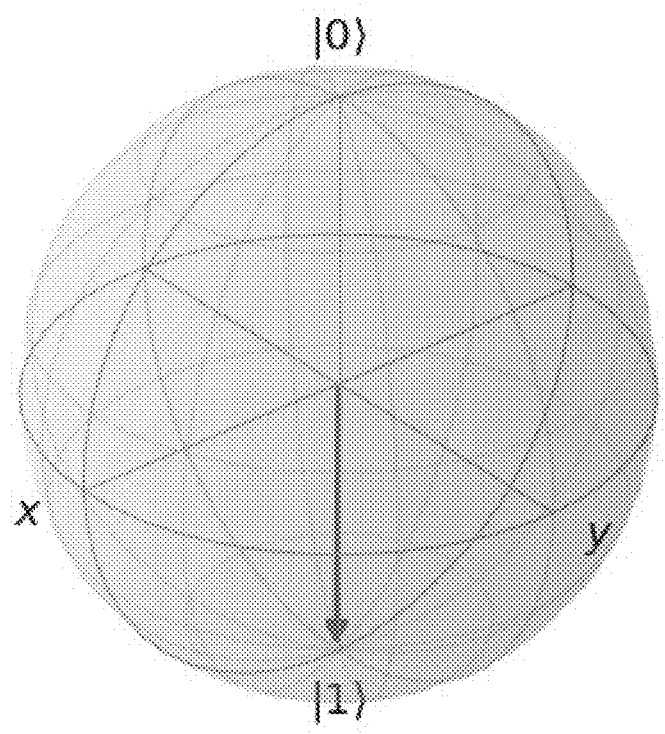
FIGS. 6A to 6E are schematics of a Bloch sphere representing the precession of a state following the application of the pulse shown in FIG. 5.
Figure 6B:
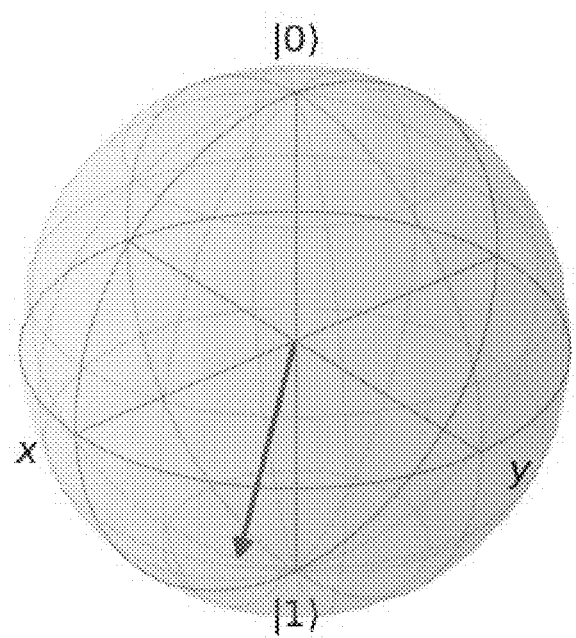
Figure 6C:
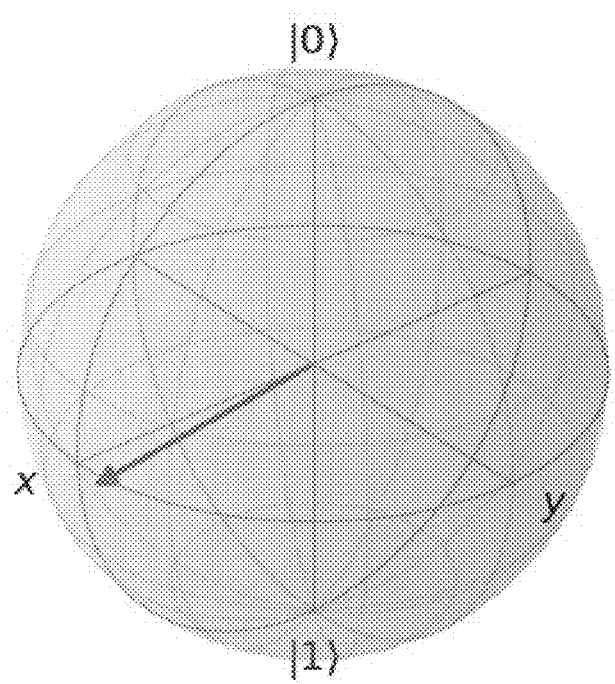
Figure 6D:
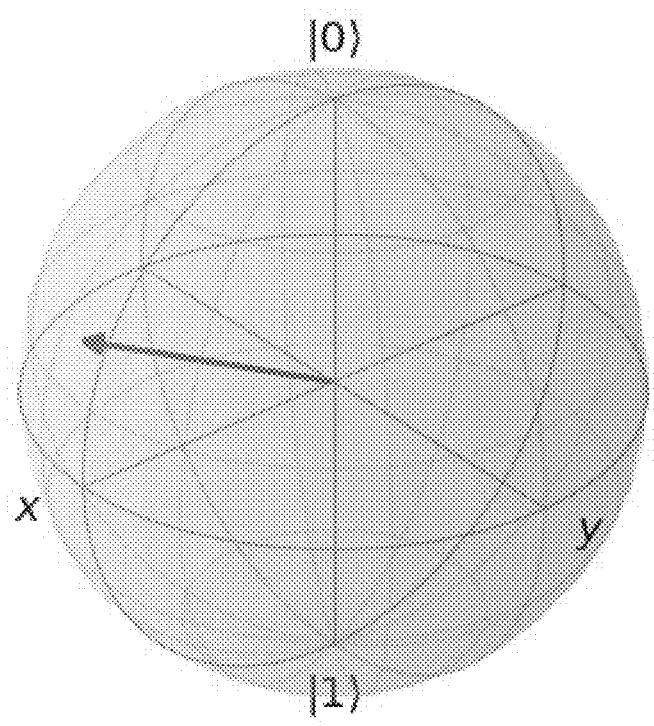
Figure 6E:
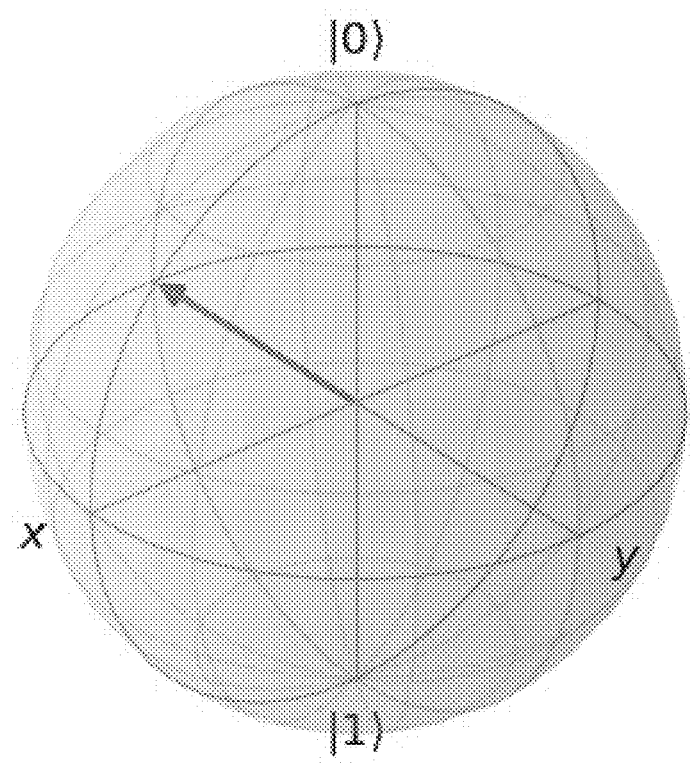

In FIG. 6A, the state is shown in the pure form $|1\rangle$ pointing towards the bottom of the sphere. First, a single flux quantum is applied across the inductor which supplies energy to the qubit to start the state transition. The arrow representing the state is seen to move off the pure state $|1\rangle$ and towards the equator as shown in FIG. 6B. The state will continue to move even if the value of flux quanta provided across the inductor stays constant. However, by incrementing the flux quanta, the transition of the state accelerates towards its top speed. FIG. 6C represents a mid-point of the total state transition. The transition of the state is held at its top speed (the plateau of the trapezium of FIG. 5) until the state starts to get close to its intended final position. At this point the flux quanta provided across the inductor 13 are decremented one-by-one and the transition of the state slows in FIG. 6D until it reaches its final desired position in FIG. 6E on the central plane of the sphere and in this case, aligned along the y axis?.

The control of a qubit using the above system provides excellent fidelity. High fidelity means that the control of the qubit evolutions is highly accurate and reproducible to low errors in execution of quantum gates.

Figure 7A:
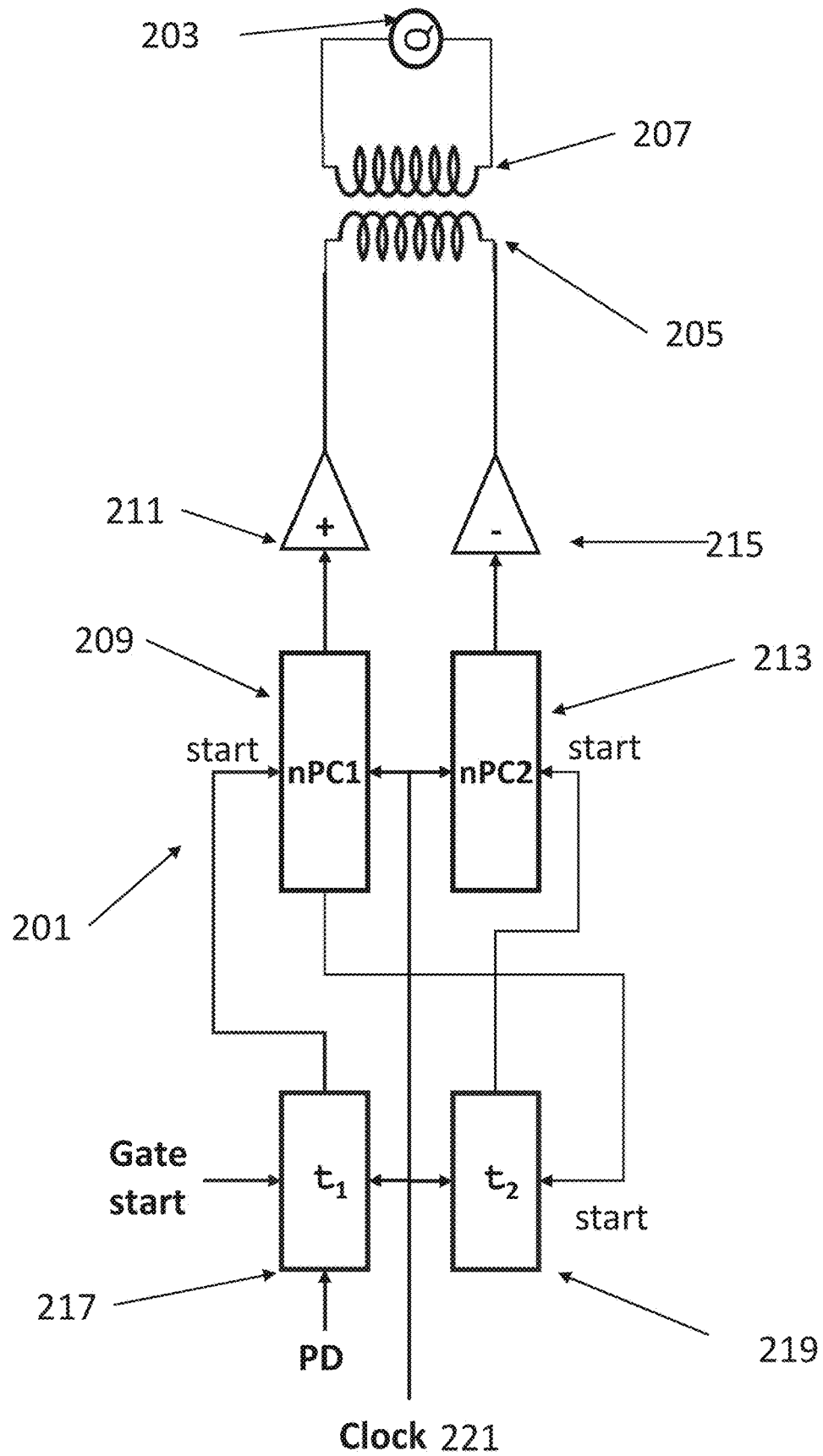
FIG. 7A is a schematic of an example of a pulse shaping circuit producing a trapezium shaped pulse and coupled to a qubit in accordance with an embodiment.

FIG. 7A is a diagram of a controller 201 which can be used to produce the flux profile of FIG. 5. The controller 201 is used to control qubit 203. The qubit 203 is capable of inductive coupling, for example, the fluxonium qubit discussed with reference to FIGS. 1A and 1B.

The controller 201 comprises an inductor 205 which is used to inductively couple to the inductance of the qubit 203. It should be noted, that the qubit 203 shown in FIG. 7A has an inductor. However, the qubit might have inductance even if there is not a specific inductor component provided. In particular, the qubits might have been constructed with SQUIDs (sometimes called split junctions) to couple flux inductively from controller. Therefore, inductive coupling can still occur.

Some components of the circuit shown in FIG. 7A will be described in more detail with reference to FIG. 8. However, at a high level, the circuit comprises first pulse counter (nPC1) 209 and second pulse counter (nPC2) 213. The first pulse counter (nPC1) 209 outputs positive SFQ pulses 211. The second pulse counter (nPC2) 213 outputs negative SFQ pulses 215. The SFQ pulses are thought of as positive and negative. However, the terms are used just to describe pulses to increase and decrease flux in inductive loop 205. The first pulse counter 209 operates to output pulses across inductor 205 to increment magnetic flux in the loop. The pulses are incremented using the first pulse counter 209 and are incremented one pulse at a time, i.e., depositing one do at a time, to form the upward slope of the trapezium shown in FIG. 5.

Once the first pulse counter 209 reaches a set value, it stops outputting positive SFQ pulses 211 and the magnetic flux in inductive loop 205 is maintained at a constant level. This represents the top of the trapezium in FIG. 5. A carry signal is also output once first pulse counter reaches a set value. The carry signal is directed to second time delay 219. After a set time counted by second time delay 219, a carry is output from second time delay 219 to second pulse counter 213 to switch on second pulse counter 213. Second pulse counter is switched on and is used to count and output SFQ pulses which have an opposing polarity to those from the first pulse counter 209. These pulses of an opposing plurality polarity reduce the flux in inductive loop 205 and hence cause a reduction in the flux. This incremental reduction of the flux corresponds to the lower slope of FIG. 5. Therefore, by using the first 209 and second 213 pulse counters, the flux profile shown in FIG. 5 can be achieved.

As shown in FIG. 7A, there are two further components shown, these are first time delay 217 and second time delay 219. The first time delay 217, second time delay 219, first pulse counter 209 and second pulse counter 213 are all counters. Each of them receives clock signal 221. The first 217 time delay-sets the time before starting the trapezium. The second time delay 219 sets the plateau of the trapezium. Any of the described counters can be implemented with the fixed number bits or programmable using the programmable counter designs shown in FIGS. 8E, 8F. The internal configuration of the first time delay 217 second time delay 219, first pulse counter 209 and second pulse counter 213 are very similar.

Figure 7B:
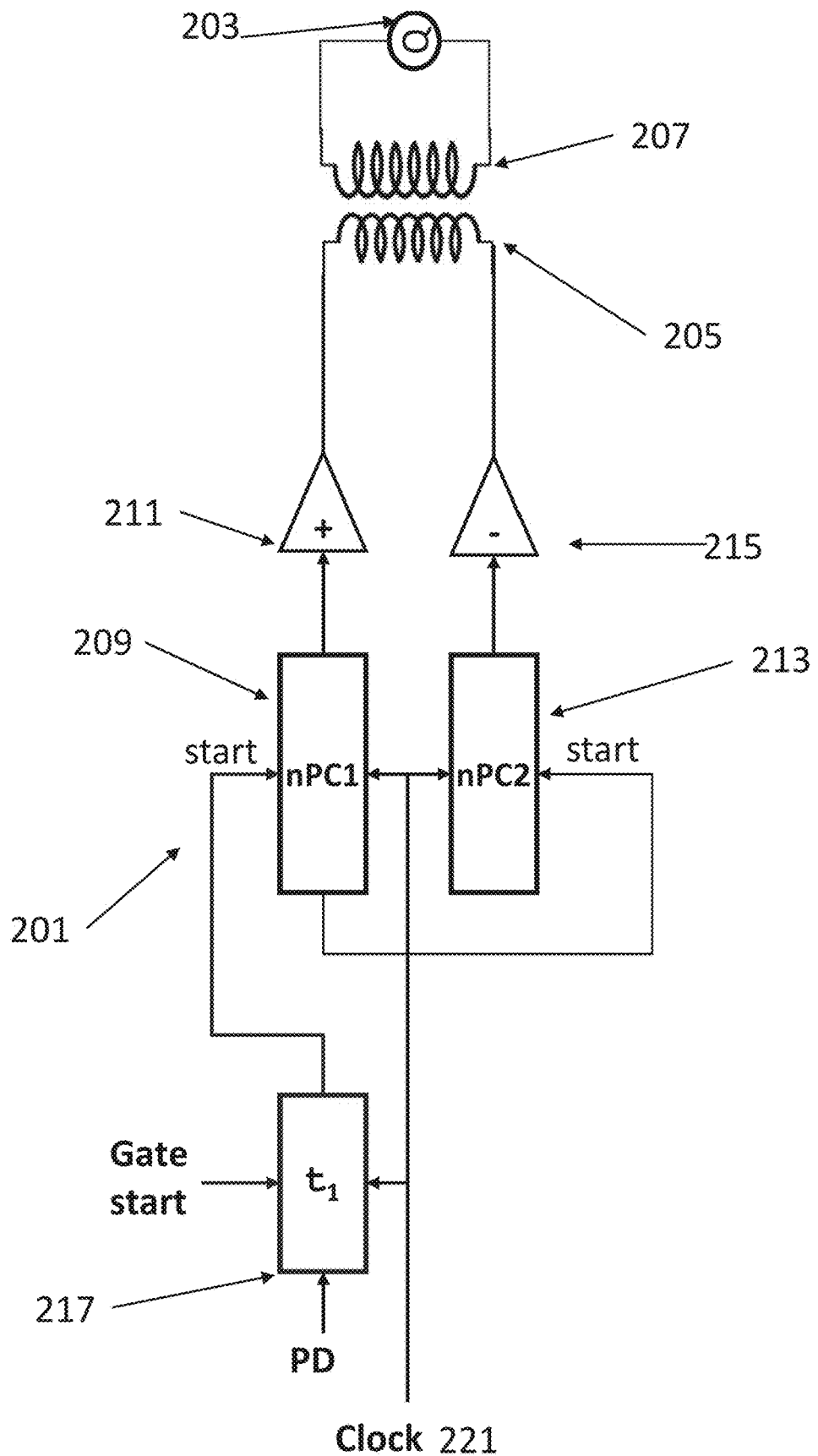
FIG. 7B is a schematic of an example of a pulse shaping circuit producing a triangle shaped pulse and coupled to a qubit in accordance with an embodiment.

FIG. 7B shows the redacted pulse shaping circuit to produce a triangle shape of the pulse, i.e., a pulse with zero duration of the plateau. Here, the second time delay, 219 is not needed.

Figure 8A:
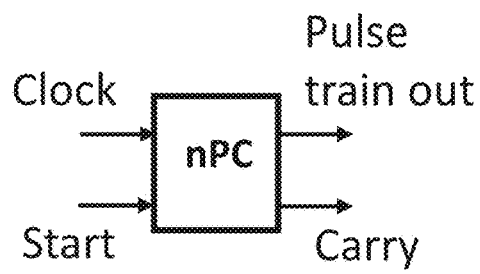
FIG. 8A is a schematic of an example of a pulse counter for use in the circuit of FIG. 7A.
Figure 8B:
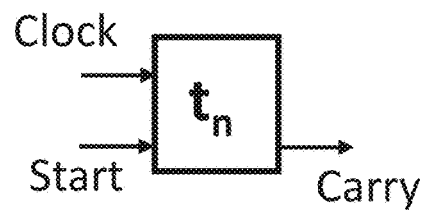
FIG. 8B is a schematic of an example of a counter (without pulse output) for use in the circuit of FIG. 7A.

FIG. 8A shows schematically the arrangement of the first and second pulse counters and FIG. 8B shows schematically the arrangement of the first and second time delays. The internal configuration of both is the same, but FIG. 8B only outputs the carry and not pulses.

Figure 8C:
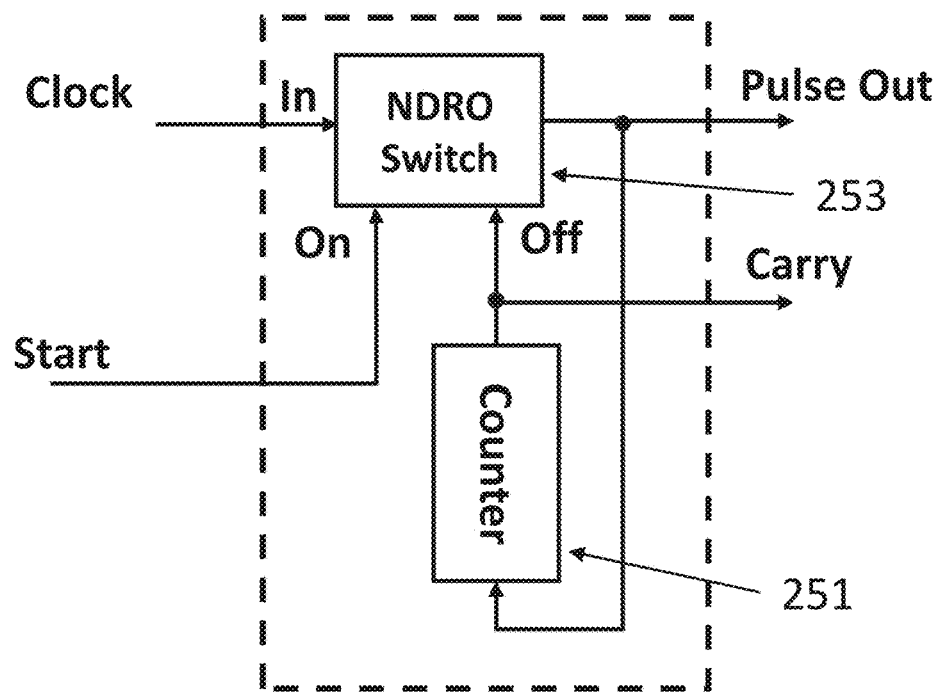
FIG. 8C is a schematic of the pulse counter of FIG. 8A in greater detail.

The internal configuration is shown in more detail in FIG. 8C. Clock input is produced from an external input, e.g. sinewave or any other periodic waveform. This input is converted to SFQ pulses using a standard dc/SFQ converter resulting in conversion of input periodic waveform into a stream of clock SFQ pulses. Examples of possible dc/SFQ converters can be found in V. K. Kaplunenko, M. I. Khabipov, V. P. Koshelets, K. K. Likharev, O. A. Mukhanov, V. K. Semenov, I. L. Serpuchenko, and A. N. Vystavkin, "Experimental Study of the RSFQ Logic Elements," *IEEE Trans. Magn.*, vol. 25, no. 2, pp. 861-864, March 1989 and S. V. Polonsky, V. K. Semenov, P. Bunyk, A. F. Kirichenko, A. Kidiyarova-Shevchenko, O. A. Mukhanov, P. Shevchenko, D. Schneider, D. Y. Zinoviev, and K. K. Likharev, "New RSFQ Circuits," *IEEE Trans. Appl. Supercond.*, vol. 3, no. 1, pp. 2566-2577, March 1993.

Here, there is provided a counter 251 which passes an SFQ pulse clock input to the output while non-destructive readout (NDRO) switch 253 is ON. Examples of possible NDRO switches can be found in O. A. Mukhanov, S. V. Rylov, V. K. Semenov, and S. V. Vyshenskii, "RSFQ Logic Arithmetic," *IEEE Trans. Magn.*, vol. MAG-25, no. 2, pp. 857-860, March 1989.

The output of the counter turns off NDRO switch 253. This results in producing the number of output pulses set by the counter 251. The counter can be of the fixed (counting $2^n$ number of clock pulses) or programmable (counting the preset number of clock pulses).

Figure 8D:
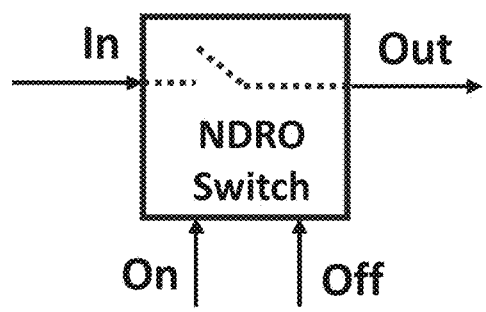
FIG. 8D is a schematic of an example of an NDRO switch.

FIG. 8D shows a schematic of an NDRO switch. The NDRO switch passes a signal from its input to its output dependent on whether the status of the switch is "on" or "off". The "on" or "off" status being controlled by at least one further input.

Figure 8E:
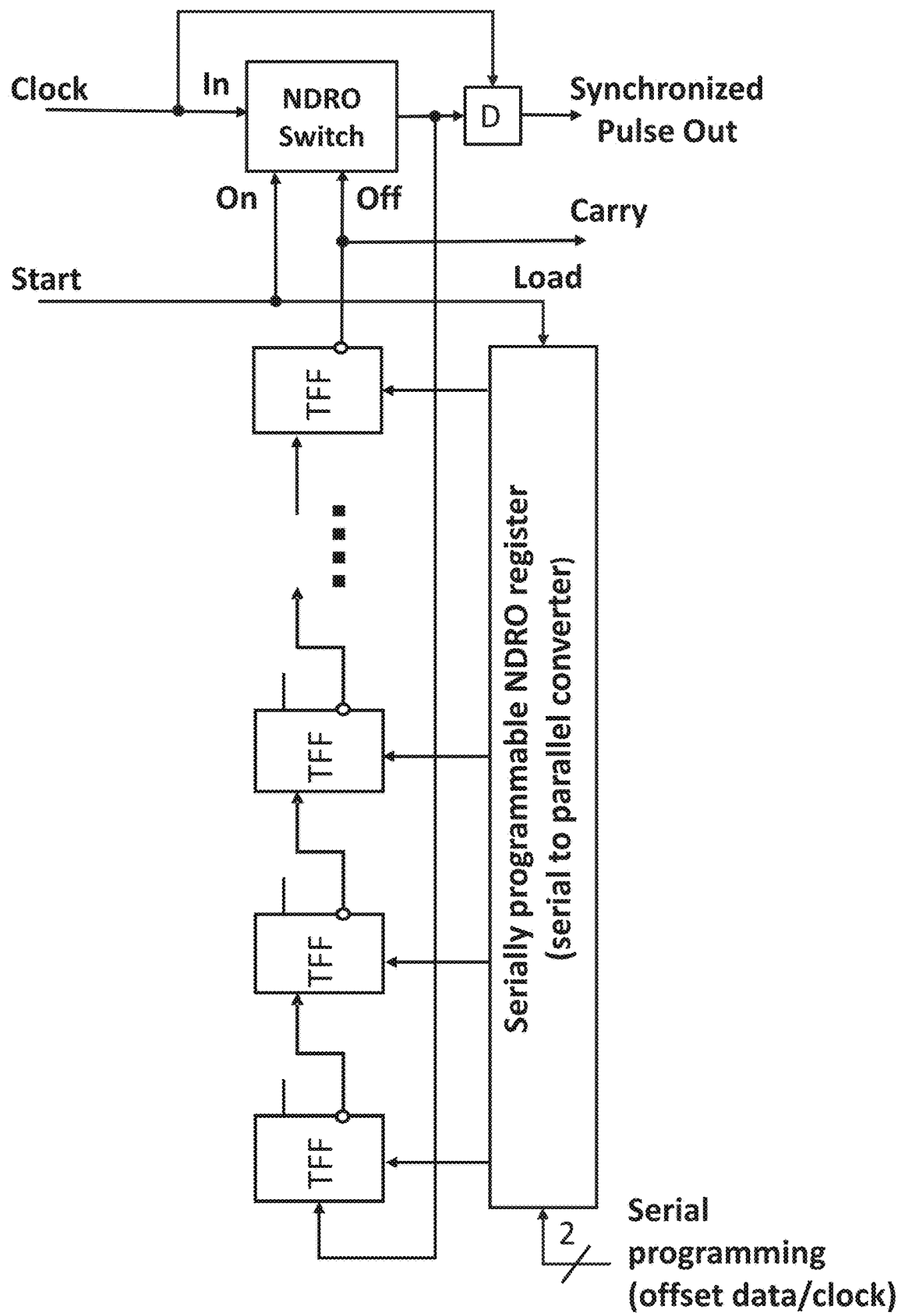
FIG. 8E is a schematic of an example of a parallelly programmable counter.
Figure 8F:
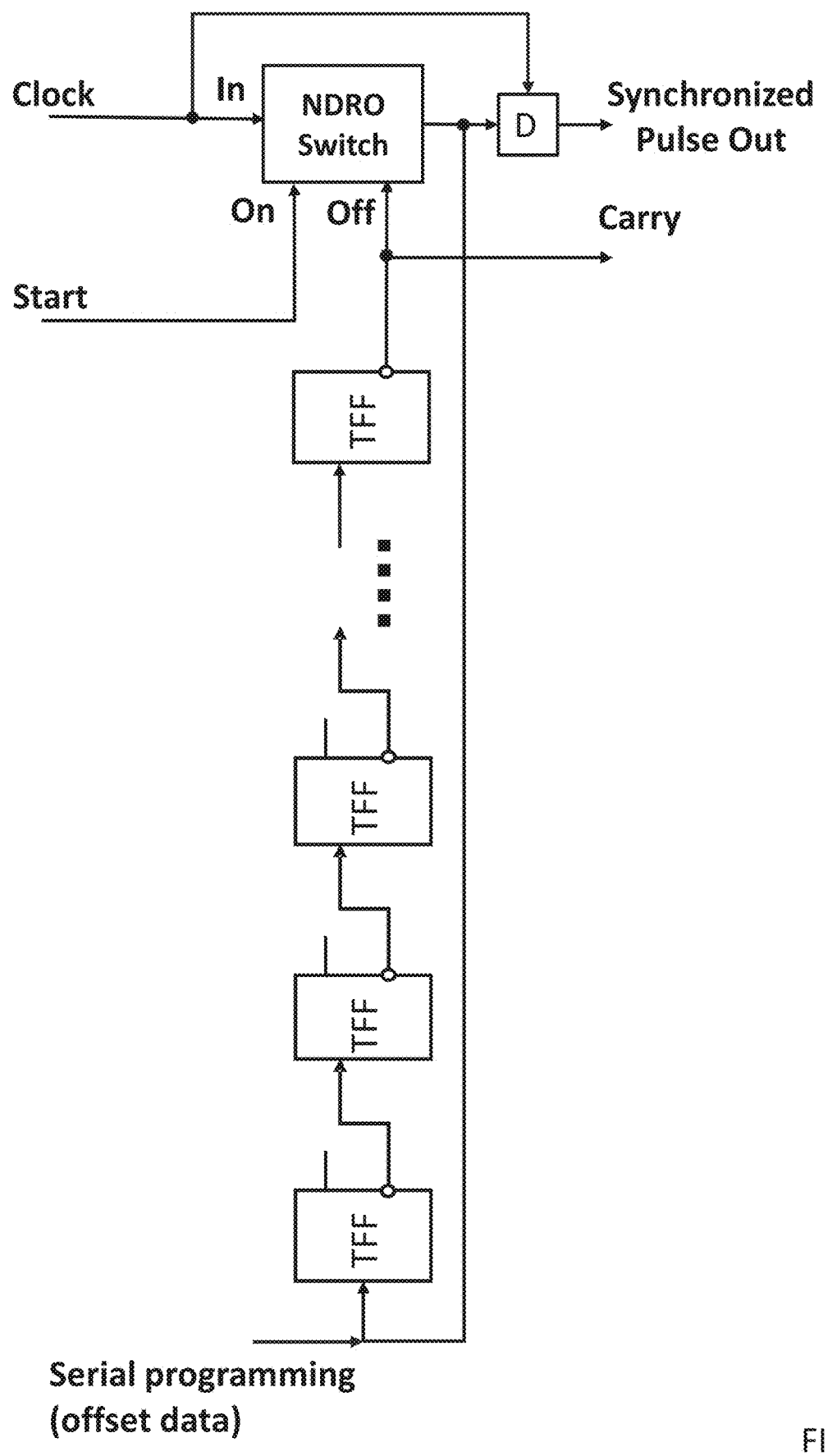
FIG. 8F is a schematic of an example of a serially programmable counter.

Two possible embodiments of a programmable counter are shown in more detail in FIG. 8E and FIG. 8F. In FIG. 8E, a counter is provided of T flip-flops (TFFs) (V. K. Kaplunenko, M. I. Khabipov, V. P. Koshelets, K. K. Likharev, O. A. Mukhanov, V. K. Semenov, I. L. Serpuchenko, and A. N. Vystavkin, "Experimental Study of the RSFQ Logic Elements," *IEEE Trans. Magn.*, vol. 25, no. 2, pp. 861-864, March 1989 and S. V. Polonsky, V. K. Semenov, P. Bunyk, A. F. Kirichenko, A. Kidiyarova-Shevchenko, O. A. Mukhanov, P. Shevchenko, D. Schneider, D. Y. Zinoviev, and K. K. Likharev, "New RSFQ Circuits," *IEEE Trans. Appl. Supercond.*, vol. 3, no. 1, pp. 2566-2577 March 1993) arranged in series which are connected to a serial-to-parallel programming interface. TFFs are RSFQ toggle flip-flops (TFFs) which are used to output SFQ pulses on every other input SFQ pulse. The serially connected TFFs are used to form a fixed counter which for the first and second time delays are used to output a carry with a fixed time delay which serves as the start inputs to the pulse counters 209, 213. In FIG. 8F, the programming is achieved by applying SFQ pulses directly to input of the first TFF before the start input is applied. In both embodiments, the applied data set the offset content of the counter limiting the number of the counted pulse after the start SFQ signal is applied. For example, a 7 bit counter would normally count $2^7=128$ clock pulses. If the programming offset data is 18, then the programmed counter will count only 128−18=110 clock pulses.

Figure 9:
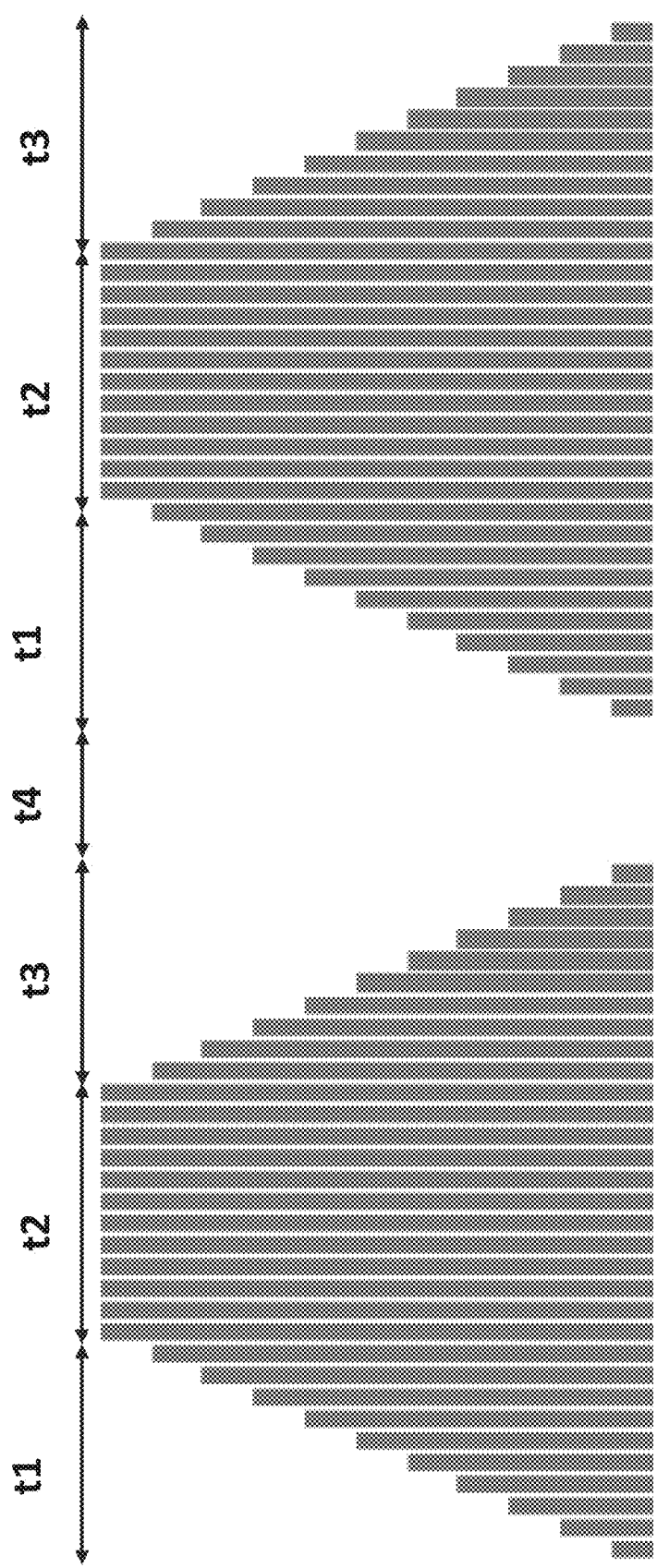
FIG. 9 is a diagram of an example of a double pulse shape which can be produced by a pulse shaping circuit in accordance with an embodiment.

In the above description, a simple case has been discussed where there is a single trapezium. However, it is also possible to use two or more trapeziums or other shapes that can be constructed from incrementing and decrementing the flux using SFQ pulses. A further example of a flux profile is shown in FIG. 9. Here the profile is a double trapezium, but three or more trapeziums could be used.

Figure 10:
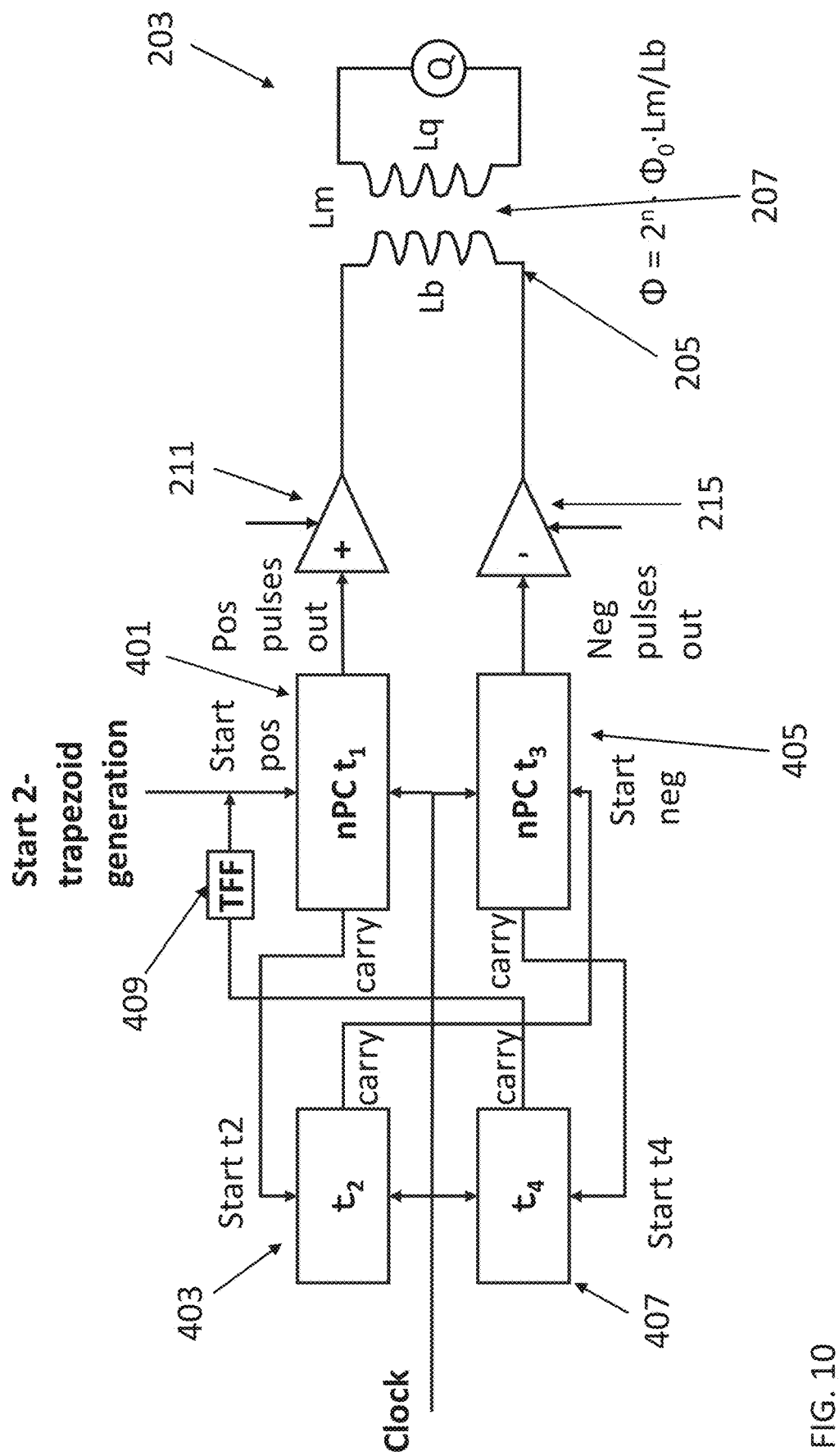
FIG. 10 is a schematic of an example of a pulse shaping circuit coupled to a qubit in accordance with an embodiment for producing a double pulse shown in FIG. 9.

FIG. 10 shows a circuit that could be used to produce a double triangle/trapezium structure. The system is similar to that of FIG. 7A in that positive pulses are provided across inductor loop 205 from positive output/input 211 and negative pulses are provided across inductor loop 205 from negative output/input 215.

In the circuit of FIG. 10, there is a first pulse counter nPCt$_1$ 401, this output is coupled directly to the positive pulse output 211. The first pulse counter 401 is of the type described with reference to FIGS. 8A and 8C where it can output both SFQ pulses and a carry signal. When the first pulse counter 401 reaches its set number of pulses (first threshold), it outputs a carry which is directed to second counter t$_2$ 403. Second counter 403 is not capable of outputting a SFQ pulse train and can only output a carry signal. It is of the type described with reference to FIG. 8B. The carry signal is output once second counter 403 reaches its threshold which will be referred to as the second threshold. The carry signal is input to third pulse counter nPC t$_3$ 405 and this output pulses which are directed across inductor loop 205 in the opposite direction to those output by the first pulse counter 401. Thus the pulses output by the third pulse counter 405 serve to decrease the flux applied across the inductor loop 205. The third pulse counter is of the type described with reference to FIGS. 8A and 8C.

Once the third pulse counter 405 has reached its threshold (third threshold), it outputs a carry which is sent to fourth counter t$_4$ 407. Fourth counter 407 is also of the type described with reference to FIG. 8B which can output a carry but which does not output pulses. Fourth counter 407 is used to separate the two trapeziums of the double trapezium. Once the count threshold of the fourth counter is reached (fourth threshold), a carry signal is output and this is passed through first TFF 409 which in turn passes a start signal to first counter 401.

The process is then repeated with the first counter for a one output in a carry once the first threshold is reached, the start of the second counted 403 which outputs a carry once a threshold is reached the output carrier from the second counter 403 then starts third counter 405 which sets the negative ramp. At this stage, either the process can stop or a second set of trapeziums can be restarted.

In the following figures, performance of a single qubit gate for fluxoniums is analysed starting with the triangle-shaped pulse which is a trapezium with a zero duration plateau. The gate is realised by applying fast detuning of the magnetic flux through the super inductor loop (qubit), when two identical trapeziums of the type shown in FIG. 9 are separated by a variable time delay.

Each pulse is constructed as a staircase with flux increments $\delta\Phi = d_f\Phi_0$ where $d_f$ is a parameter used to model the flux coupling between the controller and the qubit and $\Phi_0 = h/2e$ is the flux quantum. The separation between flux increments is determined by an external clock with a period $\delta t = dt$. Then, there is a wait for $n_{flat}$ clock periods after that the pulse is continued as a mirror image of the first half: after another $n_{flat}$ idle periods the flux decreases in increments of 8.

FIGS. 11 to 14 show a set of results for Y$\pi$/2 (Y90-degree) gates from a double trapezium pulse of the type described with reference to FIG. 9. In FIGS. 11 to 14, the following parameters are used (unless the parameters are indicated as variables in the FIGs.):

Fluxonium parameters:
$E_L/h = 1.0$ GHZ,
$E_C/h = 1.2$ GHZ,
$E_J/h = 5.6$ GHZ
(h is the Planck's constant).

The above parameters are also used to produce the fluxonium energy diagram of FIG. 1B.

The triangle has 16 pulses up and down in all cases. The clock period is 0.046 ns for double triangle pulses, and is variable for single triangular pulse. The triangle pulse is a trapezium with a zero plateau duration.

Figure 11:
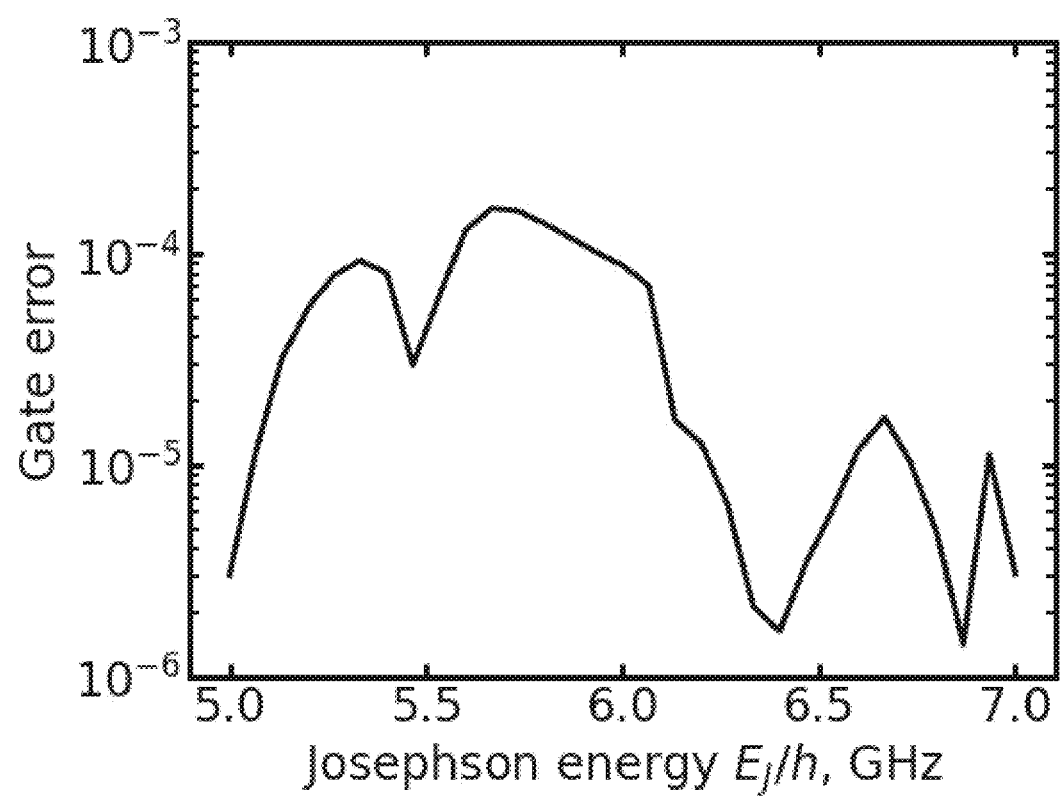
FIG. 11 is a plot of gate_error_vs_Josephson energy for clock period 47.5 ps and $d_f$=0.003.

FIG. 11 shows a plot of gate error against the Josephson energy $E_J$. It can be seen that gate errors of $10^{-4}$ down to approaching $10^{-6}$ can be reached.

Figure 12:
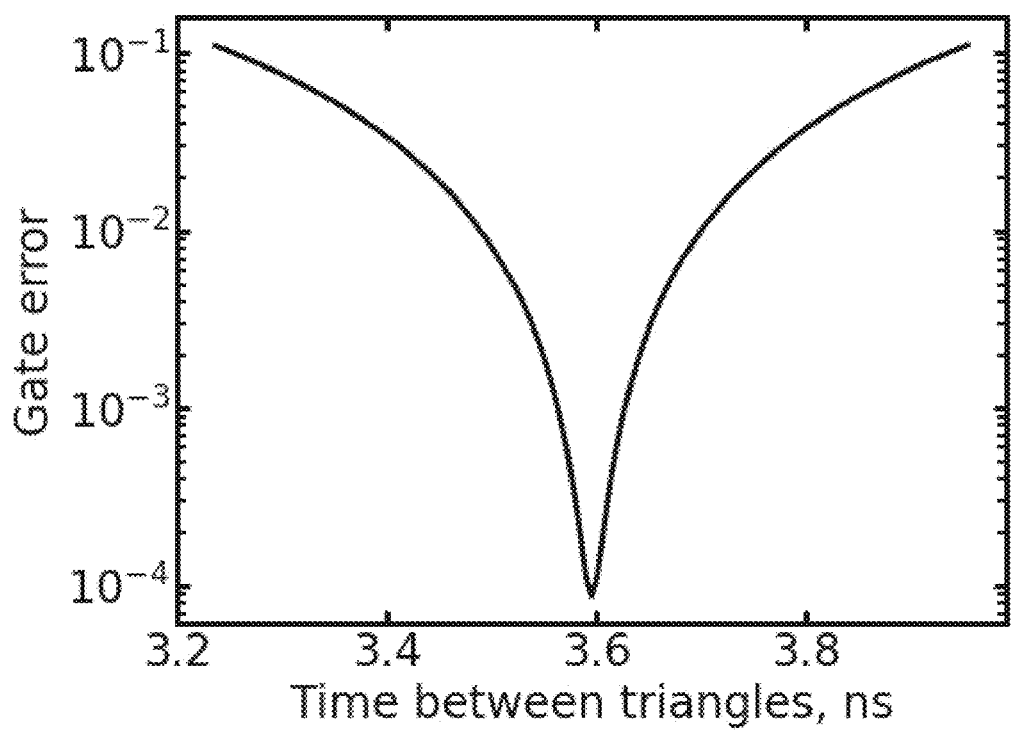
FIG. 12 is a plot of gate_error_vs_wait_time between pulses in the double pulse.

FIG. 12 is a plot of the gate error against wait time in ns which is the time between two triangles.

Figure 13:
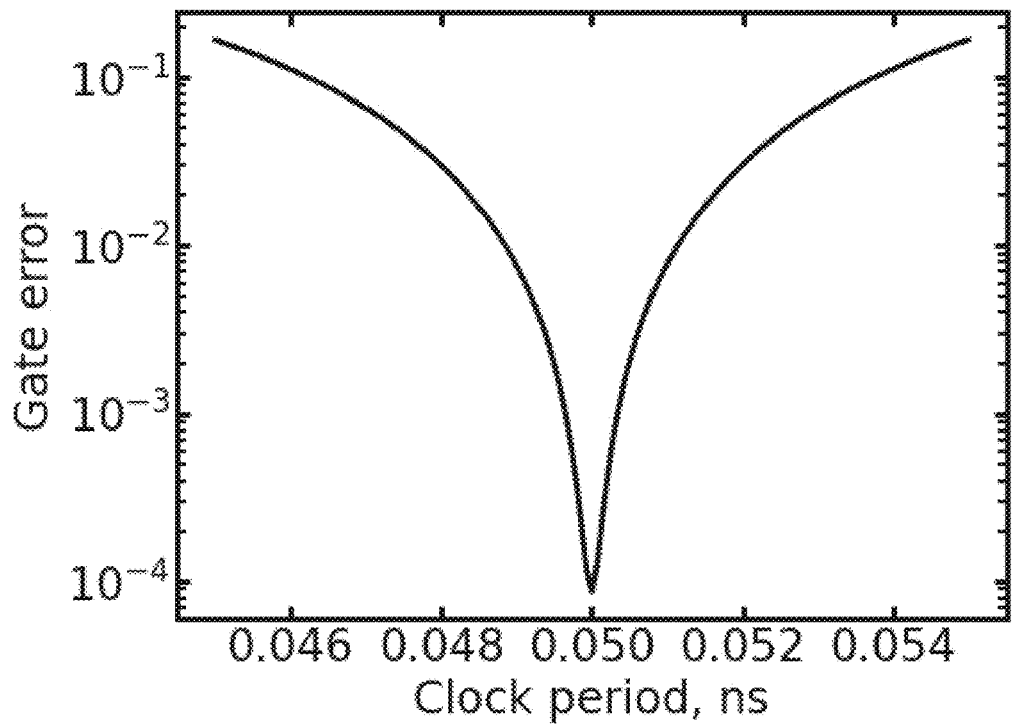
FIG. 13 is a plot of gate_error_vs_clock period.
Figure 14:
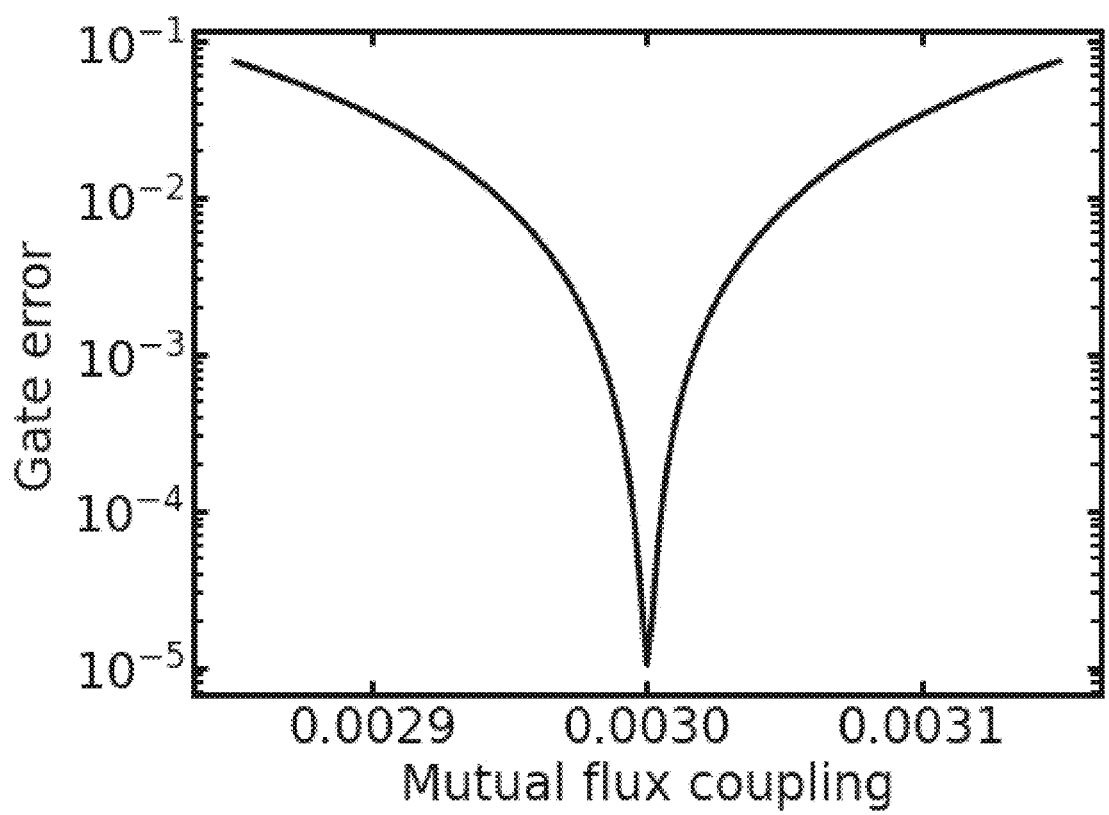
FIG. 14 is a plot of gate_error_vs_flux coupling.

FIG. 13 is a plot of the gate error against the clock period (other parameters the same as for FIG. 11). FIG. 14 is a plot of fidelity against the flux coupling (other parameters the same as for FIG. 11). The flux coupling is the flux fraction per SFQ.

The above has discussed a flux profile with one or two trapezium type shapes. However, other flux profile shapes are possible. As explained in relation to FIGS. 6A to 6E, the flux changes the speed of precession of the state on the Bloch sphere. Therefore, other shapes can be employed which cause precession of the state at various speeds. This provides more degrees of freedom for quantum gate optimization. This is the discrete optimization over $2^N$ configurations.

Figure 15:
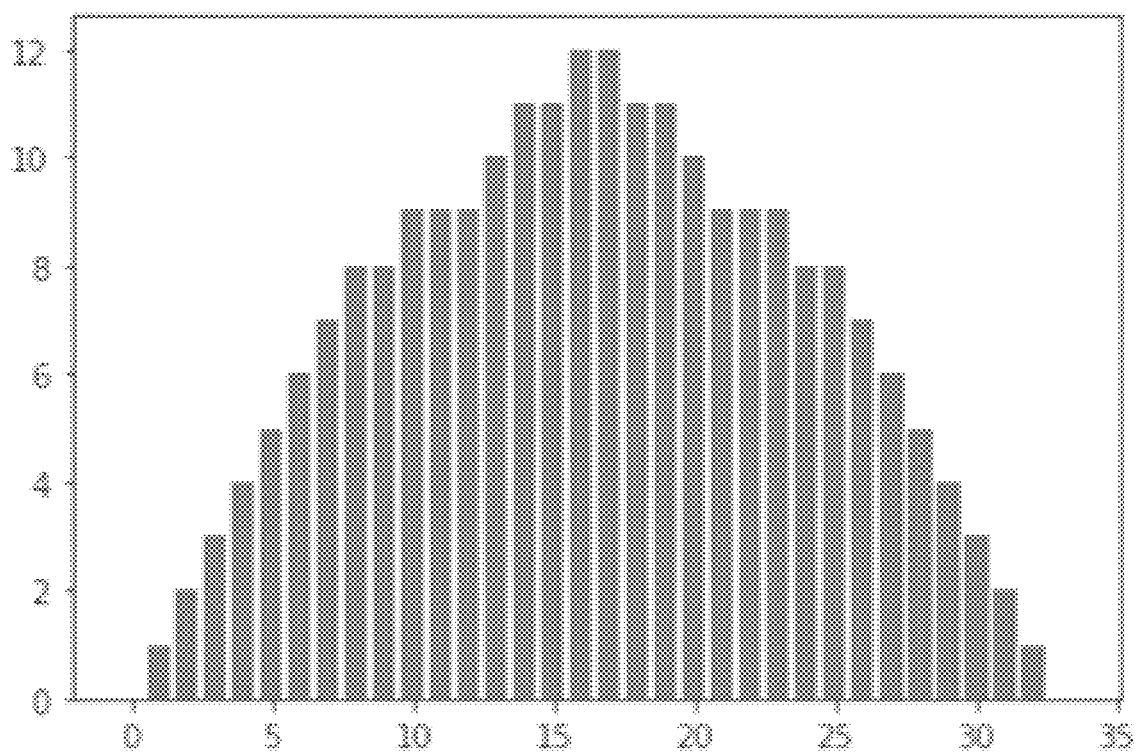
FIG. 15 is a diagram of a pulse shape which is a variation on the simple trapezium and which can be produced by a pulse shaping circuit in accordance with an embodiment.

FIG. 15 shows a variation on the trapezium of FIG. 5, which forms a triangle with a plurality of plateau portions. In FIG. 15 the flux profile is symmetric, but it does not have to be symmetric.

Figure 16:
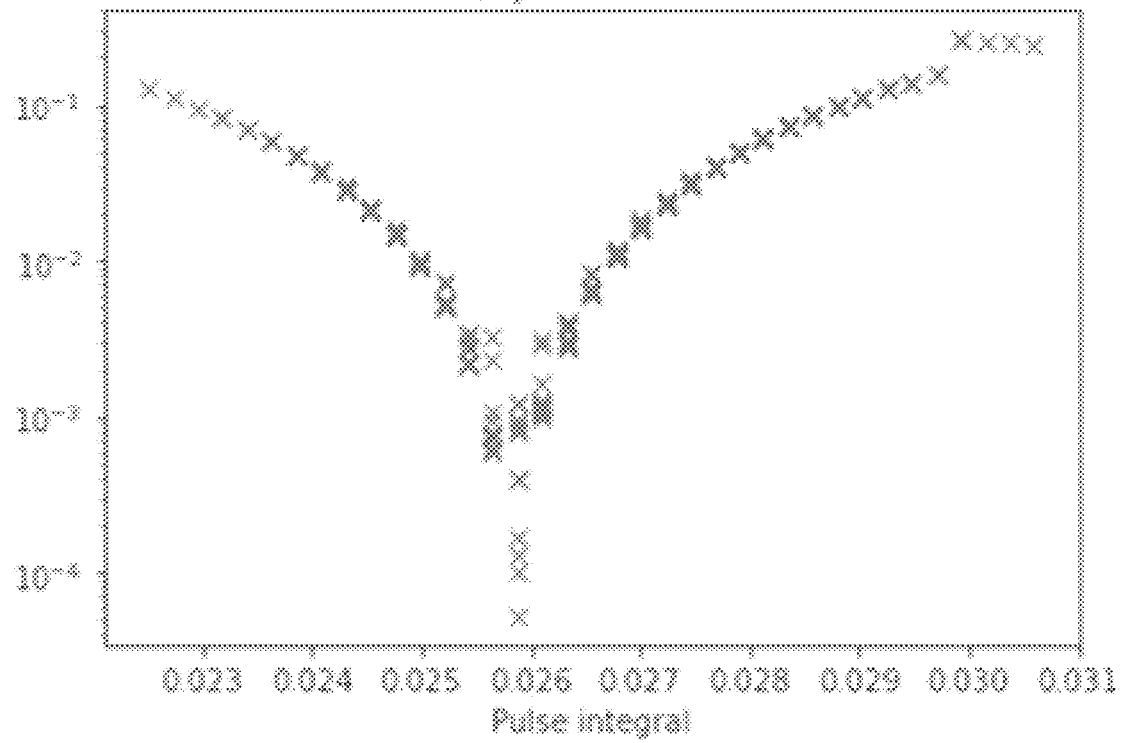
FIG. 16 is a plot of gate_error_vs_pulse integral for the pulse shape of FIG. 15 for parameters $E_L/h$=0.7 GHZ, $E_C/h$=0.9 GHZ, $E_J/h$=5.82 GHZ, time between trapeziums 3 ns, clock period 45 ps.

FIG. 16 shows a plot of the gate error against the pulse integral with a wait time of 3.0 and a pulse time difference of 0.045.

The above shows how variation of some parameters of fluxonium affects the gate fidelity. In an embodiment, the aim is to have gate fidelity below $10^{-3}$ for a wide range of parameters that are hard to realize precisely due to a fabrication spread. Amongst these parameters of the Josephson energy of the fluxonium $E_J$ and the flux coupling between the classical loop and the loops of flux super inductor that defines $\delta\Phi$. These plots show that these parameters do not have to be precise in order to achieve acceptable fidelities.

As explained above, further shapes are possible. In an embodiment, the trapezoid pulse is used as the starting shape but add additional increases at the top of the trapezoid, exploring a large variety of shapes between a triangle (no plateau at all) and the original trapezoid (no additional pulses). In the example of FIG. 7A a base trapezoid is constructed using eight continuous up-and-down pulses with the topside length of 16. The 16 clock pulses are divided into eight for increasing flux and then the remaining 8 to symmetrically decrease the flux. This allows have 28=256 combinations. The combination that provides the highest fidelity is selected.

In the above, fidelity is presented as a function of the magnetic flux integral for the sequence. This integral does not define the gate fidelity, but based on these plots, it is concluded that the integral is a good estimate for the initial choice of good sequences.

As stated above, the aforementioned controller is configured to be inductively coupled to a qubit. The above description has referred to a fluxonium qubit, but other types of qubits which have an inductance can be used. The inductance can be provided via a specific inductor integrated to the qubit or be inherent to the qubit.

Figure 17:
FIG. 17 is a schematic showing the control layers for a quantum computer.
Figure 17:
Figure 17:
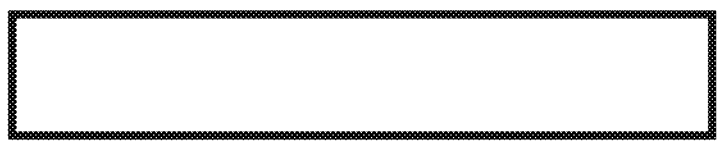
Figure 17:

For use in a quantum computer, there will be a plurality of qubits which are provided in a Qubit array 301 of FIG. 17. The control of the Qubits is provided via a Digital Qubit manager (DQM) 303. The DQM is configured to provide qubit readout, control and some data processing. In an embodiment, the above described controller will be provided within the DQM 303. A controller will be provided for each qubit in the qubit array 301.

In an embodiment, in addition to the DQM 303 and qubit array 301, a high speed digital SFQ controller and quantum error correction controller 305 is provided to communicate with DQM 303. This functions to control the DQM 303 and provided classical co-processing and quantum error correction.

Also, in an embodiment, an interface 307 which is a high-speed digital SFQ co-processor and cryoCMOS memory and co-processor 307 is provided. This provides classical co-processing, deep memory and an interface with external computers and networks.

Figure 18:
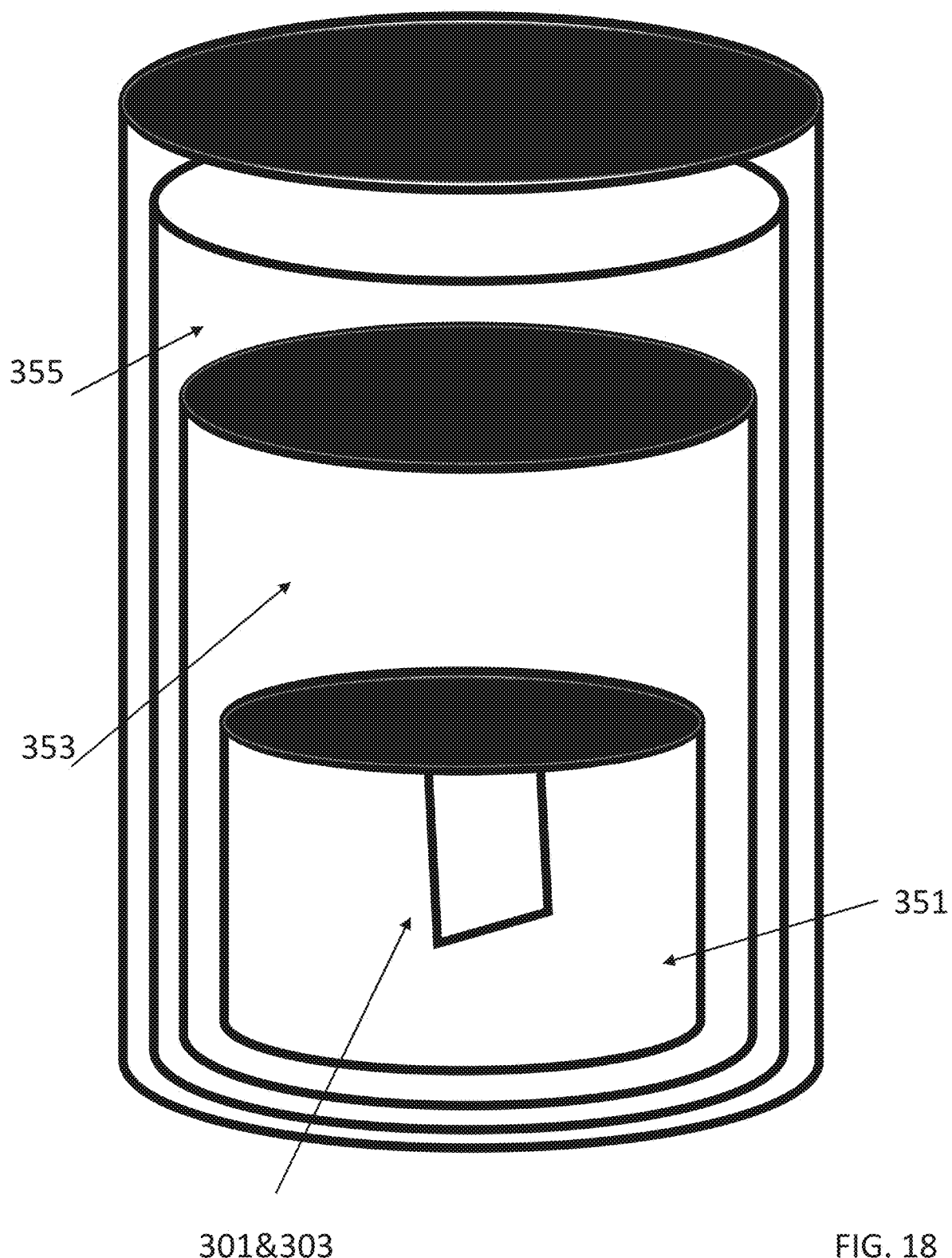
FIG. 18 is a schematic showing an example of a cryostat and where the control layers of FIG. 17 sit within the cryostat.

In an embodiment, the 4 layers: qubit array 301, DQM 303, DQM control and error correction 305 and interface 307 are provided within a low temperature environment such as a cryostat or dilution fridge. Such a possible arrangement is shown schematically in FIG. 18. Here, the cryostat has a plurality of chambers which are held at different temperatures with the innermost chamber 351 being held at the lowest temperature. The innermost chamber 351 is used to hold the qubit array 301 and the DQM 303. In an embodiment, the innermost chamber 351 is held at the lowest temperature. For current technology, this is approximately 20 mK. The middle chamber 353 can be used to hold DQM control and error correction 305 which does not need to be held at such a low temperature as the qubit array 301 and the DQM 303. The middle chamber 353 may be held at a temperature which is approximately 600 mK. The interface 307 may then be provided in the outer chamber 355 which is held at approximately 3K.

Figure 19:
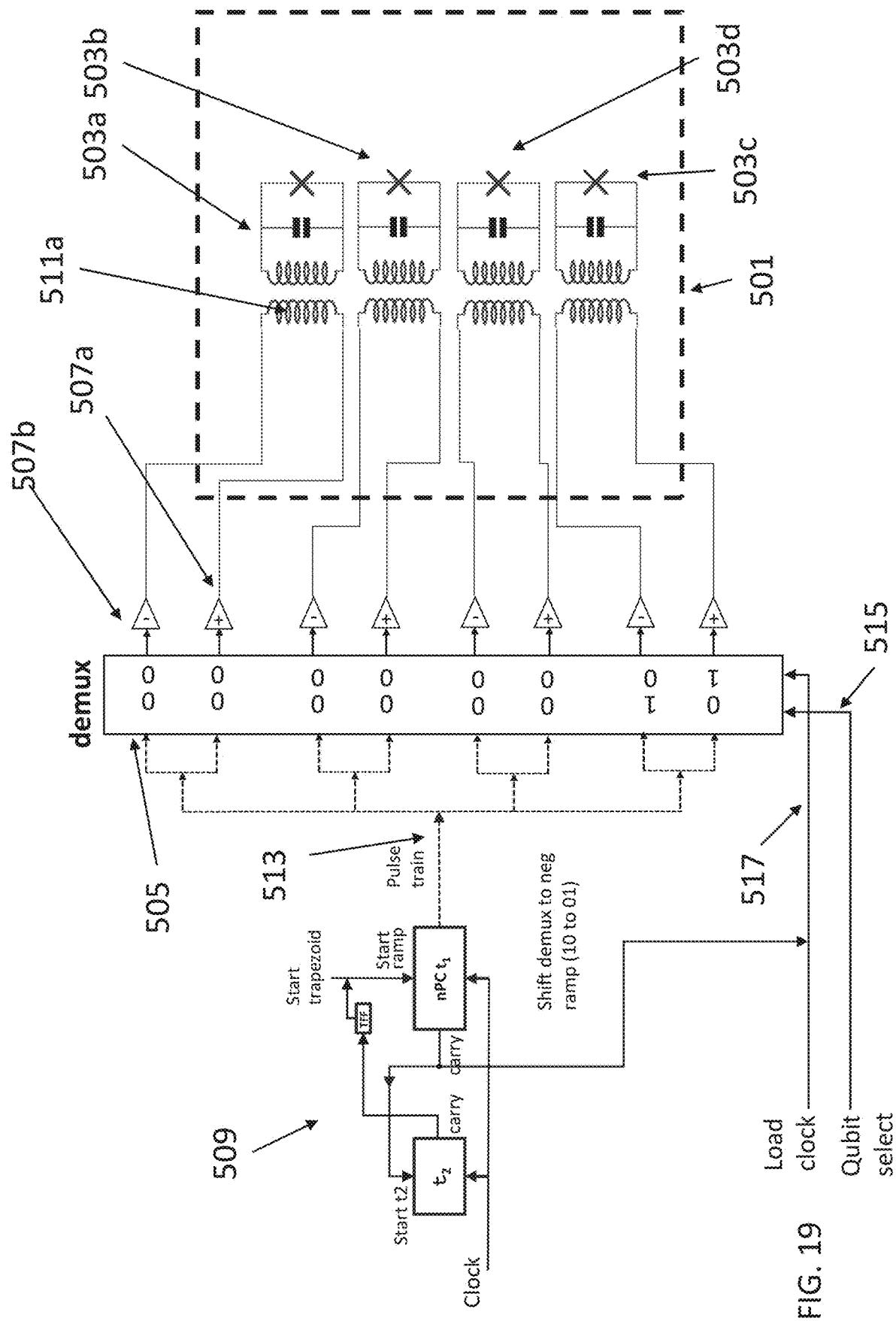
FIG. 19 is a schematic of an example of a pulse shaping circuit coupled to a plurality of qubits via demultiplexer in accordance with an embodiment.

FIG. 19 is a schematic showing the demultiplexed control of a fluxonium qubit chip 501. In this specific example, four qubits (503a-503d) are shown. However, any number of qubits could be used. In the same way as described earlier in relation to FIG. 7A, each qubit 503a-503d is controlled by receiving SFQ pulses which are applied either from a first side 507a (positive input) across an inductor 511a which is inductively coupled to the qubit or from a second side 507b (negative input) across the inductor. Pulses applied from the first side positive pulses that increase the flux within the loop and pulses applied second side and negative pulses decrease the flux within the loop. The positive pulses generate the rising edge of the current pulse shape (e.g., trapezium) and negative pulses generate the falling edge of the current pulse shape.

The positive input 507a and the negative input 507b are connected to demux unit 505. Demux unit 505 is a digital unit which receives an input pulse train 513 from generator 509 and also receives a demux load clock signal 517 or signals from generator 509 and a qubit selection signal 515.

The selection signal can be thought of as providing a gating signal which indicates which of the positive inputs 507a and negative inputs 507b are to be open (set to 1) for each of the four qubits 503a-503d and which of the positive inputs 507a and negative inputs 507b are to be closed (set to 0) for each of the four qubits 503a-503d. Each qubit is provided with its own positive and negative input.

For example, in the figure, the selection signal for a first clock period is set to 10 00 00 00 which indicates that the positive input for qubit 503d is open and in the second clock period shown, the selection signal is set to 01 00 00 00 which indicates that the negative input for qubit 503d is open and all other positive and negative inputs are closed.

Figure 20:
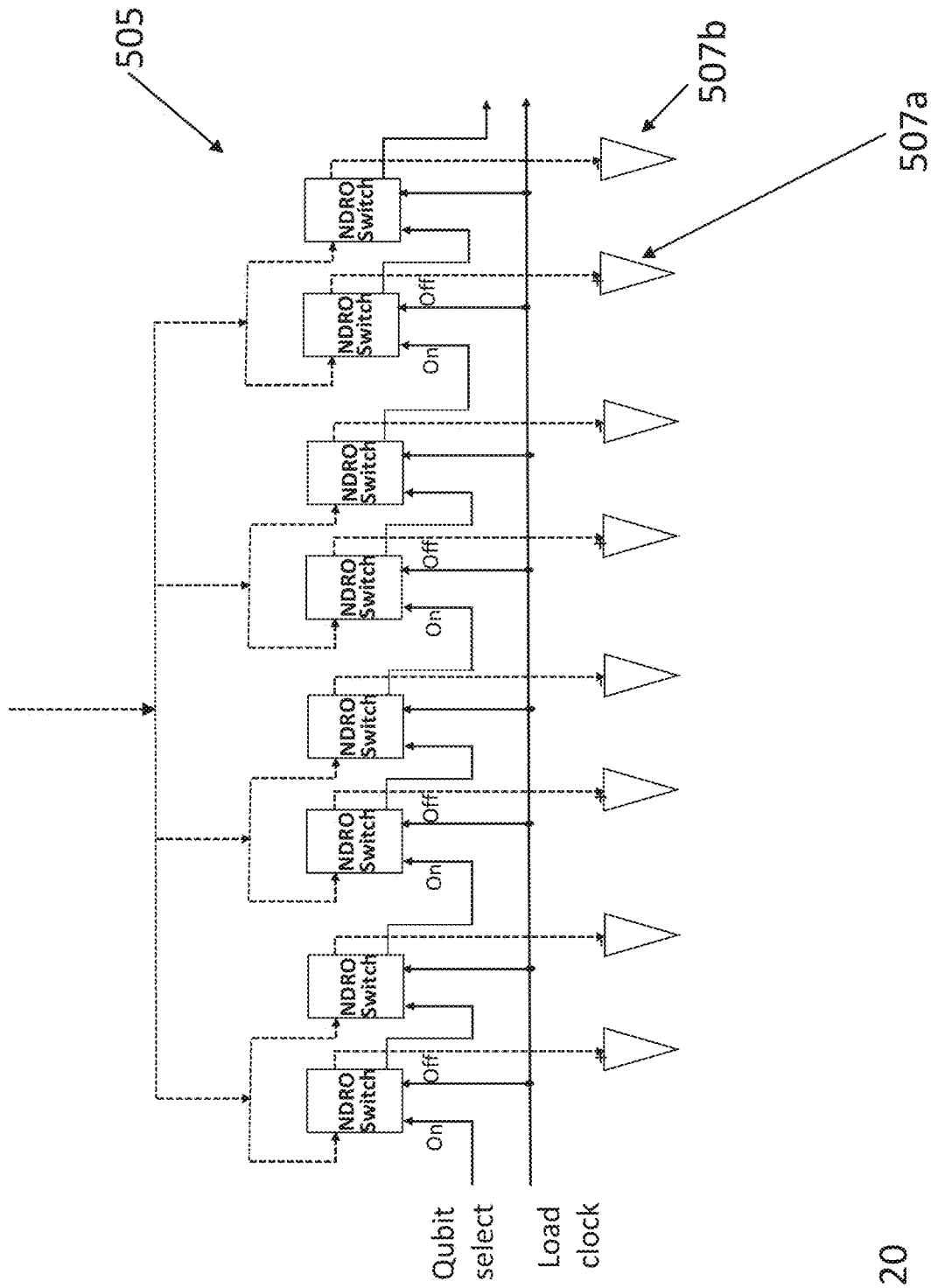
FIG. 20 is a schematic of an example of the demultiplexer used in FIG. 19.

FIG. 20 shows a possible arrangement for demux 505. The demux 505 comprises an array of NDRO switches each of which are coupled to a positive input or a negative input for a qubit. Each NDRO is also coupled to the input pulse train 513 such that each NDRO acts as a switch to allow or prevent a pulse from pulse train 513 from being passed to the respective positive input or negative input coupled to the NDRO. The path of the input pulse through to the positive input or negative input is shown as a dotted line.

Whether a NDRO is configured to allow or prevent a pulse from the input pulse train 513 from being transferred to the respective positive or negative input is determined by the selection signal. The NDRO's may be arranged in the form of a shift register with the carry from each NDRO in the register being provided as an input to the "on" of the next switch in the register. The "off" of each NDRO being connected to the clock line. The selection signal can be therefore configured to allow a "1" from an NDRO which is coupled to a positive input to transfer to the adjacent NDRO which is coupled to a negative input for the same qubit to allow the pulse shape of the flux applied to the qubit to be controlled as explained with reference to FIG. 10.

The generator 509 which is used to produce pulse train 513 is in some ways similar to the circuit of FIG. 10. However, generator 509 only needs to produce an incremented (ramped) part of the shape of the flux pulse and a plateau region, there is no need for generator 509 to provide a pulse train which is used to decrement the flux since the direction of pulses flowing through the loop is controlled by the positive and negative inputs of the qubit which are coupled to the demux. Thus, generator 509 just needs to supply a pulse train of one polarity.

Figure 21:
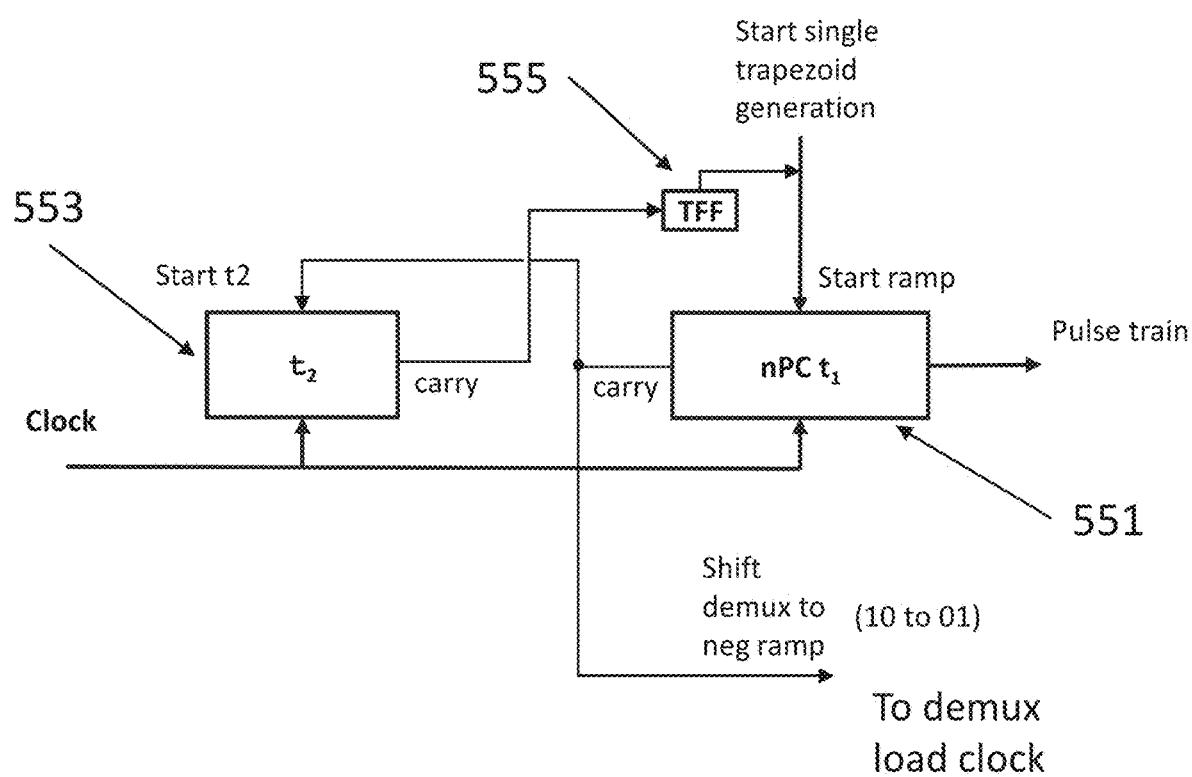
FIG. 21 is a schematic of an example of a pulse shaping circuit to be used in the circuit of FIG. 19.

An arrangement of the generator 509 is shown in FIG. 21. The generator comprises a first pulse counter nPC $t_1$ 551 which is a counter which can output both a pulse train and a carry and may be of the type described with reference to FIG. 8A. The first pulse counter receives a start signal to start to output pulses which are supplied to the demux. This forms the ramp signal which is passed to the demux, the demux allowing the addition of SFQ pulses to a loop to increment the flux in a qubit of the quantum chip. The ramp signal can be provided to one or more qubits of the quantum chip, which ones are selected for receiving the ramp signal is set by the demux.

Once the first counter 551 has counted its set number of pulses, a carry signal is outputted to second counter $t_2$ 553 which is a counter of the type described with reference to FIG. 8B. A signal is also sent to the demux to direct future pulses for the qubits which are being addressed to the negative input. Thus, for each qubit which is being addressed, the signal across the positive and negative inputs is changed from 10 to 01.

After a set number of clock periods, a carry is outputted to the via a toggle flip flop TFF 555 which is set to direct the carry signal to start the first counter again and toggle the TFF. The period where the second counter 553 is counting defines the plateau. The start of the first counter 551 is then set by the carry from the first counter, the first counter then starts to generate SFQ pulses again. However, as the demux directs the pulses to the negative inputs, this has the effect of decreasing the flux applied across the inductor which is coupled to the qubit. When TFF 555 receives the input signal again from t2 counter 553, it will not generate the start signal for nPC $t_1$ 551, since TFF was toggled earlier. As a result, only one trapezium is generated.

Thus, from the above, it can be seen how the circuit of FIG. 19 can be used to control 4 qubits with a trapezium type flux shape of the type shown in FIG. 5.

Figure 22:
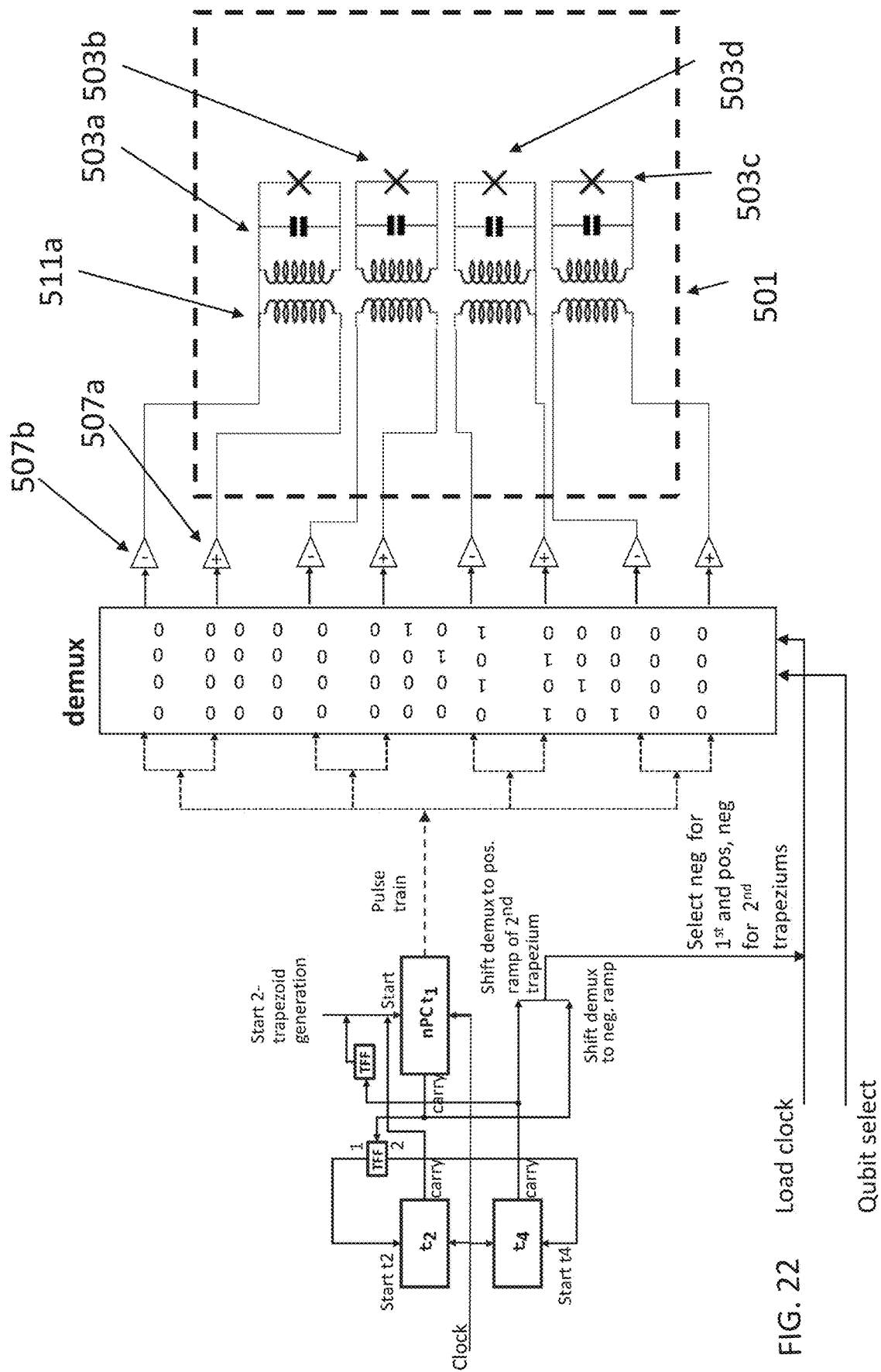
FIG. 22 is a schematic of an example of a pulse shaping circuit configured to produce a double pulse coupled to a plurality of qubits via demultiplexer in accordance with an embodiment.

FIG. 22 is a variation on the system of FIG. 19. Here, the circuit of FIG. 22 is configured for controlling the quantum chip using two trapeziums as opposed to a single trapezium.

The arrangement of the qubit chip 501 is identical to that described with reference to FIG. 19 and will not be described further here. Further, the positive input and negative input applied to each of the inductor loops 511a which are coupled to each qubit are also the same as those described with reference to FIG. 19. However, the form of the demux used is different to that described in relation to FIG. 19 in order to allow the double-trapezium generation and demultiplexing.

Figure 23:
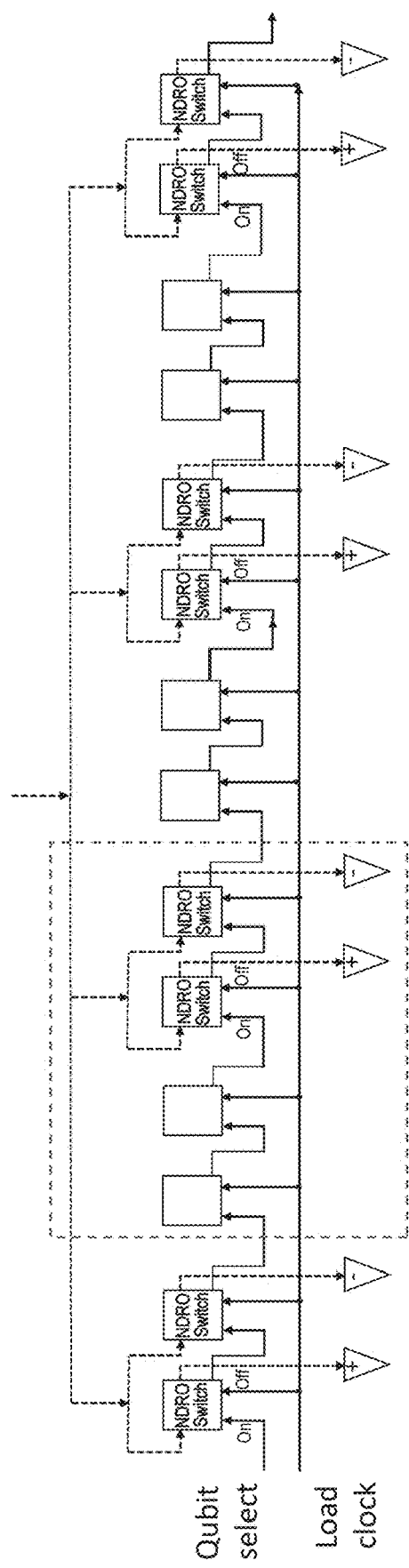
FIG. 23 is a schematic of an example of the demultiplexer used in FIG. 22.

FIG. 23 shows a possible example of the type of demux which can be used in FIG. 22. In many ways, it is similar to that shown in FIG. 20. However, here, the register is formed from pairs of dummy switches (DFFs) provided between pairs of NDRO switches in order to hold control data for the second trapesium. Due to the nature of the shift register which forms the demux, the pattern inputted into the demux is shifted along the register to enable channels to different qubits.

In order to form a double trapezium, it is necessary to program the demux to allow a positive ramp followed by a plateau, followed by a negative ramp, followed by a gap, followed by a second positive ramp, followed by a second plateau, followed by a second negative ramp. Programming this sequence to the first two NDRO switches of the shift register requires no particular modifications. However, programming NDRO switches later in the register is more problematic. To avoid this, dummy flip-flops (DFFs) are provided between the pairs of NDRO switches. Therefore, to program a double trapezoid, the following sequences can be applied to the arrangement of DFF-DFF-NDRO-NDRO outlined by the dotted box:

| | |
|---|---|
| $1^{st}$ trapezium | 1010 |
| | 0101 |
| $2^{nd}$ trapezium | 0010 |
| | 0001 |

Figure 24:
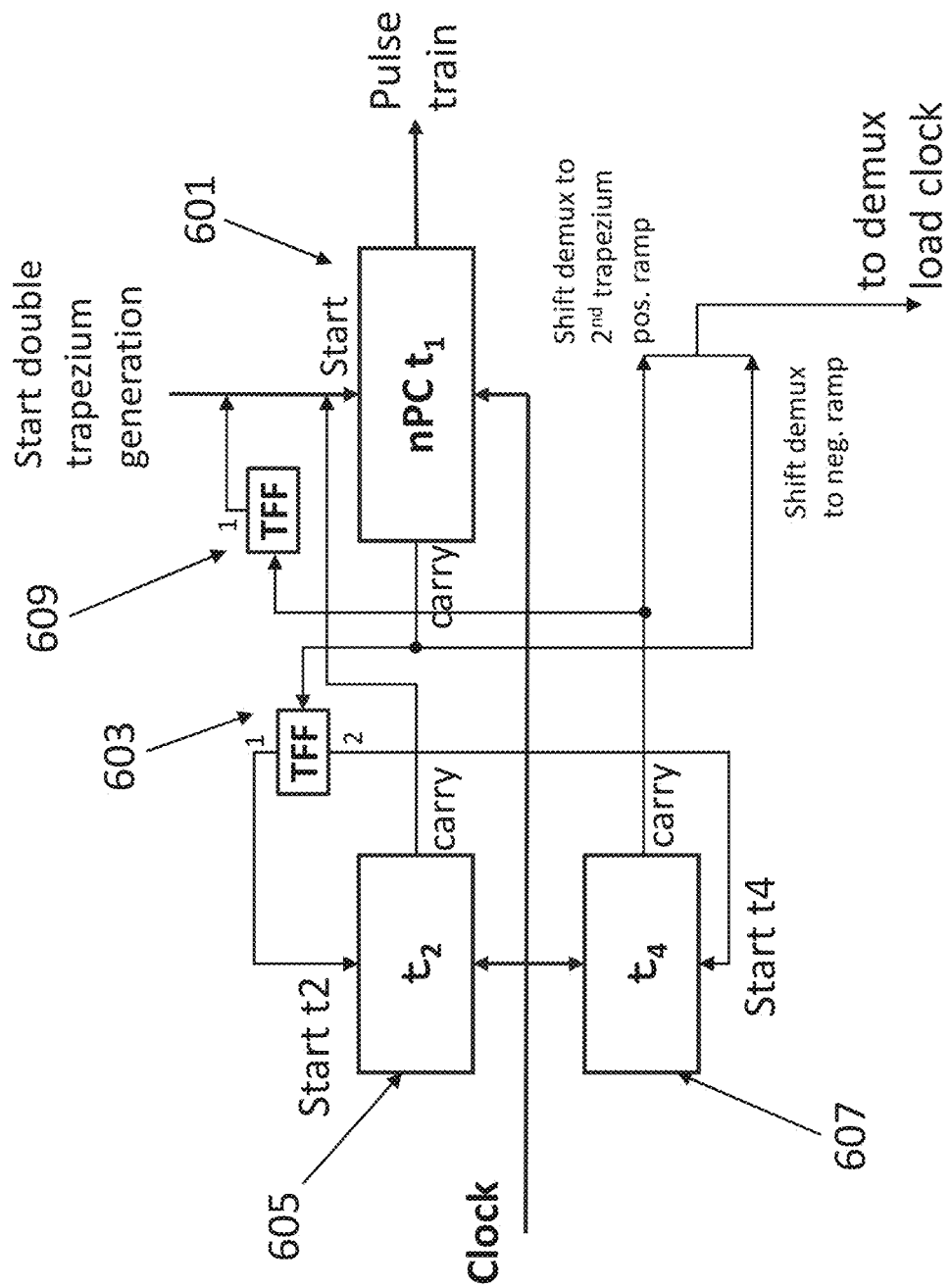
FIG. 24 is a schematic of an example of a pulse counter circuit to be used in the circuit if FIG. 22.

Also, the form of the generator is different for a double trapezium is different. FIG. 24 shows the generator in more detail. There is a first pulse counter nPC $t_1$ 601 which has a structure similar to that described with reference to FIG. 8A and which can output a pulse train. This receives a start signal to start the ramp of pulses. Once first pulse counter 601 reaches its counting limit (first limit), a first carry signal is output to instruct the demux to switch to the negative ramp as explained previously in relation to FIG. 19. Also, the carry signal is passed through first TFF 603 which is set to direct the carry signal first directly to second counter $t_2$ 605. Second counter $t_2$ 605 is identical to second counter $t_2$ 553 which is described with reference to FIG. 21. Also, second counter 605 is similar in structure to that described with reference to FIG. 8B. When the second counter 605 is counting, a plateau is formed since the flux across the inductor loop is kept constant. Once second counter 605 has counted and reached its limit (second limit) a carry signal is output which is this restarts first counter 601 to start output impulses. However, as explained above, since the demux has now been switched to negative, this output of pulses causes a negative ramp and reduces the flux applied to the inductor loop.

Once the first threshold has been reached, a carry signal is output again from the first pulse counter 601 and this is directed to first TFF 603 once again which in this case directs the carry to towards third counter $t_4$ 607. Third counter 607 is also similar in structure to that described with reference to FIG. 8B and again is used to keep the flux through the loop constant. In this case, the third counter 607 controls the separation between first trapezium the second trapezium. Once the threshold of the third counter (third limit) has been reached, a carry signal is output from the third counter 607 and this shifts the demux to positive inputs from the negative inputs. The carry signal also outputs via second TFF 609 to restart the process again where the first pulse counter 601 starts to ramp up the pulsed signal until it reaches the first limit. Once the first limit is reached, a carry signal is output to first TFF 603 and this is directed into the second counter 605 and the demux to change to the negative inputs. When the second counter 605 reaches its second limit, it outputs a carry signal which starts the first counter 601 to start recounting and output pulses which will form the negative ramp, thus completing the second trapezium.

Whilst certain embodiments have been described, these embodiments have been presented by way of example only, and are not intended to limit the scope of the implementations and/or applications of the disclosed technology. Indeed, the novel devices, and methods described herein may be embodied in a variety of other forms; furthermore, various omissions, substitutions and changes in the form of the devices, methods and products described herein may be made based on what is disclosed or illustrated.

What is claimed is:

1. A controller for a superconducting qubit, the controller comprising:
    an inductance configured to be inductively coupled to a qubit;
    a pulse shaping circuit configured to apply a current pulse with a predefined shape across the inductance, the pulse shaping circuit comprising:
        a superconducting circuit configured to output single flux quanta "SFQ" pulses; and
        a counter circuit configured to produce the shape of the current pulse by controlling the number of SFQ pulses applied across the inductance by incrementing or decrementing the current across the inductance by one SFQ pulse at a time.

2. The controller of claim 1, wherein the counter circuit is configured to produce the shape of the current pulse from positive SFQ pulses with a positive polarity and negative SFQ pulses with a negative polarity, the counter circuit being configured to increment the current across the inductance by applying positive SFQ pulses across the inductor and the counter being configured to decrement the current across the inductance by applying negative SFQ pulses across the inductor.

3. The controller of claim 2, wherein the counter circuit is configured to produce a current pulse with a shape which comprises a rising edge where positive SFQ pulses are incrementally applied, a plateau region where the current applied across the inductance is fixed and a falling edge where negative SFQ pulses are incrementally applied to reduce the current applied across the inductance.

4. The controller of claim 3, wherein the shape of the current pulse has a plurality of plateaux.

5. The controller of claim 3, configured to allow control of at least one of the following parameters of the pulse shape:
the size of the plateau(s),
the size of rising edge(s),
the size of falling edge(s),
the delay between sequentially generated flux pulses,
the delay before the start of the first flux pulse.

6. The controller of claim 2, wherein the superconducting circuit comprises a Josephson Junction "JJ" and is configured to output an SFQ pulse due to a $2\pi$ phase increment across the JJ.

7. The controller of claim 6, wherein the superconducting circuit is at least one of the following types: rapid single flux quanta quantum "RSFQ", ERSFQ, eSFQ, RQL, xSFQ, xeSFQ, DSFQ, bSFQ, PCL and their variants and also circuits based on quantum flux parametrons "QFP": AQFP, QFP, PQ and their variants.

8. The controller of claim 2, wherein the counting circuit comprises a first counter configured to count and limit the number of positive SFQ pulses and a second counter configured to count and limit the number of negative SFQ pulses.

9. The controller of claim 8, further comprising a third counter, the third counter being configured to control the time duration for when no pulses are being output across the inductance.

10. The controller of claim 9, wherein the first, second, and third counters each comprises a register.

11. The controller of claim 10, wherein each register is configured to output a carry signal when its limit has been reached, the controller being configured such that the first, second and third counters are arranged in a sequence and the carry signals are directed from one counter to the next counter in the sequence to start the next counter in the sequence.

12. The controller of claim 10, wherein the registers comprise a plurality of superconducting T Flip flops "TFFs".

13. The controller of claim 9, being configured to produce a pulse shape with a repeating structure, the controller further comprising a fourth counter being configured to control the time between the structures of the repeating pulse structures.

14. The controller of claim 1, being adapted to control a plurality of qubits via a de-multiplexer.

15. The controller of claim 14, further comprising a plurality of inductances such that each inductance out of the plurality of inductances is configured to be coupled to a respective qubit.

16. The controller of claim 15, wherein a positive input and a negative input is provided across each inductance, the positive input being configured to increase the flux across its respective inductance and the negative input being configured to decrease the flux across its respective inductance, the de-multiplexer being connected to the positive and negative input for each inductance.

17. The controller of claim 16, wherein the de-multiplexer is configured to receive a pulse stream and a selection signal to control which of the respective positive and negative inputs of each inductance are to receive the pulse stream.

18. The controller of claim 17, wherein the pulse shaping unit comprises a single pulse counter for outputting pulses to the positive or negative inputs.

19. The controller of claim 17, wherein the de-multiplexer comprises a shift register, the selection signal being provided sequentially along the shift register.

20. The controller of claim 19, wherein the shift register comprises non-destructive read-out "NDRO" components provided in sequence, with an NDRO coupled a respective positive or negative input.

21. The controller of claim 20, further comprising dummy components between the NDROs which allow the selection signal to be stored before being passed to the next NDRO in the sequence.

22. The controller of claim 1, wherein the pulse shape is configured to allow a qubit which is inductively coupled to the controller to be transitioned to a quantum superposed state.

23. A quantum bit device with controller, wherein the controller is a controller according to claim 1 which is inductively coupled to a quantum bit device.

24. A quantum bit device with controller according to claim 23, wherein the quantum bit device is a flux quantum bit device with inductance.

25. A quantum bit device with a controller according to claim 24, wherein the quantum bit device is a fluxonium type quantum bit device.

26. A quantum bit device with controller according to claim 23, wherein the quantum bit device and controller are both provided in a low temperature measurement system at a temperature of less than 1K.

* * * * *